United States Patent
Sakano et al.

(10) Patent No.: US 8,754,452 B2
(45) Date of Patent: Jun. 17, 2014

(54) SOLID-STATE IMAGING DEVICE, METHOD OF MANUFACTURING SAME, AND ELECTRONIC APPARATUS

(75) Inventors: Yorito Sakano, Kanagawa (JP); Keiji Mabuchi, Kanagawa (JP)

(73) Assignee: Sony Corporation (JP)

( * ) Notice: Subject to any disclaimer, the term of this patent is extended or adjusted under 35 U.S.C. 154(b) by 470 days.

(21) Appl. No.: 12/943,449

(22) Filed: Nov. 10, 2010

(65) Prior Publication Data

US 2011/0121371 A1 May 26, 2011

(30) Foreign Application Priority Data

Nov. 25, 2009 (JP) ................................. 2009-267339

(51) Int. Cl.
   *H01L 27/148* (2006.01)
(52) U.S. Cl.
   USPC .............................. 257/228; 257/292; 438/57
(58) Field of Classification Search
   USPC .......... 257/292, E27.162, 223, 224, 228, 229, 257/230, 432; 438/34
   See application file for complete search history.

(56) References Cited

U.S. PATENT DOCUMENTS

| | | | |
|---|---|---|---|
| 2002/0008814 A1* | 1/2002 | Honbo et al. | 349/110 |
| 2005/0077588 A1* | 4/2005 | Kasuga | 257/432 |
| 2007/0042519 A1* | 2/2007 | Nomura et al. | 438/34 |
| 2008/0297634 A1* | 12/2008 | Uya | 348/294 |
| 2010/0201834 A1* | 8/2010 | Maruyama et al. | 348/222.1 |

FOREIGN PATENT DOCUMENTS

JP   2007-258684   10/2007

* cited by examiner

*Primary Examiner* — Olik Chaudhuri
*Assistant Examiner* — John M Parker
(74) *Attorney, Agent, or Firm* — Sheridan Ross P.C.

(57) ABSTRACT

A solid-state imaging device includes a plurality of photoelectric conversion units configured to receive light and generate signal charge, the plurality of photoelectric conversion units being provided in such a manner as to correspond to a plurality of pixels in a pixel area of a semiconductor substrate; and pixel transistors configured to output the signal charge generated by the photoelectric conversion units as electrical signals. Each of the pixel transistors includes at least a transfer transistor that transfers the signal charge generated in the photoelectric conversion unit to a floating diffusion corresponding to a drain. A gate electrode of the transfer transistor is formed in such a manner as to extend with a gate insulating film in between from a channel formed area to a portion where the photoelectric conversion unit has been formed on the surface of the semiconductor substrate.

11 Claims, 18 Drawing Sheets

IMG

SOLID-STATE IMAGING DEVICE, METHOD OF MANUFACTURING SAME, AND ELECTRONIC APPARATUS

BACKGROUND OF THE INVENTION

1. Field of the Invention

The present invention relates to a solid-state imaging device, a method of manufacturing the solid-state imaging device, and an electronic apparatus.

2. Description of the Related Art

Electronic apparatuses, such as digital video cameras and digital still cameras, include solid-state imaging devices. For example, electronic apparatuses include, as solid-state imaging devices, complementary metal oxide semiconductor (CMOS) image sensors and charge coupled device (CCD) image sensors.

Solid-state imaging devices have a plurality of pixels arranged on the surface of a semiconductor substrate. Each pixel is provided with a photoelectric conversion unit. A photoelectric conversion unit is, for example, a photodiode, and receives light that enters through an externally provided optical system on the light-receiving surface thereof and photoelectrically converts the light, thereby generating signal charge.

In CMOS image sensors among the solid-state imaging devices, pixels are formed in such a manner as to each contain, in addition to a photoelectric conversion unit, a pixel transistor. The pixel transistor is configured to read the signal charge generated by the photoelectric conversion unit, and output it as an electrical signal to a signal line.

Among solid-state imaging devices, there is a "top surface irradiation type" in which light that enters from the top surface side of a semiconductor substrate on which circuit elements, wiring, and the like are provided, is received by a photoelectric conversion unit.

In the case of the "top surface irradiation type", there is a case in which because circuit elements, wiring and the like shield or reflect light, it is difficult to improve sensitivity.

For this reason, a "bottom surface irradiation type" has been proposed in which a photoelectric conversion unit receives light that enters from the bottom surface side opposite to the top surface of the semiconductor substrate on which circuit elements, wiring, and the like are provided (see, for example, Japanese Patent No. 379435).

In the "bottom surface irradiation type", it has been proposed that by providing a control electrode for controlling the potential of a photodiode on the top surface side in which wiring and the like are provided, sensitivity and transfer characteristics are improved and also, the occurrence of dark current is suppressed (see, for example, Japanese Unexamined Patent Application Publication No. 2007-258684).

SUMMARY OF THE INVENTION

However, in such a case described above, a photodiode may be damaged when an etching process in a manufacturing step is performed, and problems, such as occurrence of white spots or deterioration in dark characteristics, may occur.

Furthermore, in a case where a control electrode is to be provided, a solid-state imaging device is formed in such a manner that the section between the control electrode and a transfer electrode becomes narrow. Consequently, there is a case in which the number of manufacturing steps increases, and the cost increases.

For this reason, it has been difficult to improve the image quality of captured images.

Accordingly, it is desirable to provide a solid-state imaging device, a method of manufacturing the solid-state imaging device, and an electronic apparatus, which are capable of improving, for example, the image quality of captured images.

According to an embodiment of the present invention, there is provided a solid-state imaging device including: a plurality of photoelectric conversion units configured to receive light and generate signal charge, the plurality of photoelectric conversion units being provided in such a manner as to correspond to a plurality of pixels in a pixel area of a semiconductor substrate; and pixel transistors configured to output the signal charge generated by the photoelectric conversion units as electrical signals, each of the pixel transistors being provided on a second surface of the semiconductor substrate opposite to a first surface of the semiconductor substrate, and the first surface having the photoelectric conversion units that receive light provided thereon, wherein each of the pixel transistors includes at least a transfer transistor that transfers the signal charge generated in the photoelectric conversion unit to a floating diffusion corresponding to a drain, and wherein a gate electrode of the transfer transistor is formed in such a manner as to extend with a gate insulating film in between from a channel formed area to a portion where the photoelectric conversion unit has been formed on the second surface of the semiconductor substrate.

Preferably, each of the photoelectric conversion units includes at least a first impurity area of a first conduction type, and a second impurity area of a second conduction type different from the first conduction type. Preferably, the first impurity area and the second impurity area are sequentially formed from the first surface side toward the second surface side on the semiconductor substrate.

Preferably, the photoelectric conversion unit further includes a third impurity area of the first conduction type. Preferably, the third impurity area is formed nearer the second surface than the second impurity area on the semiconductor substrate is.

Preferably, the first conduction type is of a p type, and the second conduction type is of an n type.

Preferably, a gate electrode of the transfer transistor is formed from polysilicon, and includes an impurity of the first conduction type or the second conduction type.

Preferably, a gate electrode of the transfer transistor is formed from polysilicon. Preferably, in the gate electrode, a portion on the side of the photoelectric conversion unit includes an impurity of the first conduction type. Preferably, in the gate electrode, a portion other than the portion on the side of the photoelectric conversion unit includes an impurity of the second conduction type.

Preferably, in the gate electrode of the transfer transistor, a portion on the side of the floating diffusion has a transfer signal applied thereto. Preferably, in the gate electrode, a portion other than the portion on the side of the floating diffusion has a voltage different from that on the side of the floating diffusion applied thereto.

According to another embodiment of the present invention, there is provided an electronic apparatus including: a plurality of photoelectric conversion units configured to receive light and generate signal charge, the plurality of photoelectric conversion units being provided in such a manner as to correspond to a plurality of pixels in a pixel area of a semiconductor substrate; and pixel transistors configured to output the signal charge generated by the photoelectric conversion units as electrical signals, each of the pixel transistors being provided on a second surface of the semiconductor substrate opposite to a first surface of the semiconductor substrate, and the first surface having the photoelectric conversion units that receive light provided thereon, wherein each of the pixel transistors includes at least a transfer transistor that transfers the signal charge generated in the photoelectric conversion unit to a floating diffusion corresponding to a drain, and wherein a gate electrode of the transfer transistor is formed in such a manner as to extend with a gate insulating film in between from a channel formed area to a portion where the photoelectric conversion unit has been formed on the second surface of the semiconductor substrate.

According to another embodiment of the present invention, there is provided a method of manufacturing a solid-state imaging device, including the steps of: providing a plurality of photoelectric conversion units that receive light and generate signal charge in such a manner as to correspond to a plurality of pixels in a pixel area of a semiconductor substrate; and providing pixel transistors that output the signal charge generated in the photoelectric conversion units as electrical signals on a second surface of the semiconductor substrate opposite to a first surface of the semiconductor substrate on which the photoelectric conversion units receive light, wherein the step of providing the pixel transistors includes at least forming a transfer transistor that transfers the signal charge generated in the photoelectric conversion unit to a floating diffusion corresponding to a drain, and wherein in the step of providing the transfer transistor, the transfer transistor is formed in such a manner that a gate electrode of the transfer transistor extends with a gate insulating film in between from a channel formed area to a portion where the photoelectric conversion unit has been formed on the second surface of the semiconductor substrate.

In the embodiment of the present invention, a transfer transistor is formed in such a manner that, on the second surface of the semiconductor substrate, the gate electrode of the transfer transistor extends with a gate insulating film in between from the channel formed area to the portion where the photoelectric conversion unit is formed.

According to the embodiment of the present invention, it is possible to provide a solid-state imaging device, a method of manufacturing the solid-state imaging device, and an electronic apparatus, which are capable of improving, for example, the image quality of captured images.

DESCRIPTION OF THE PREFERRED EMBODIMENTS

Embodiments of the present invention will be described below with reference to the drawings.

The description will be given in the following order.
1. First Embodiment (case where TG exists on PD)
2. Second Embodiment (case in which TG includes p-type part and n-type part)
3. Third Embodiment (case where PD does not contain p+ area)
4. Fourth Embodiment (case where voltage differing from that in n-type part is applied to p-type part of TG)
5. Others 1. First Embodiment (1) Device Configuration (1-1) Configuration of Main Portion of Camera FIG. 1 is a block diagram illustrating the configuration of a camera 40 according to a first embodiment of the present invention.

Figure 1:
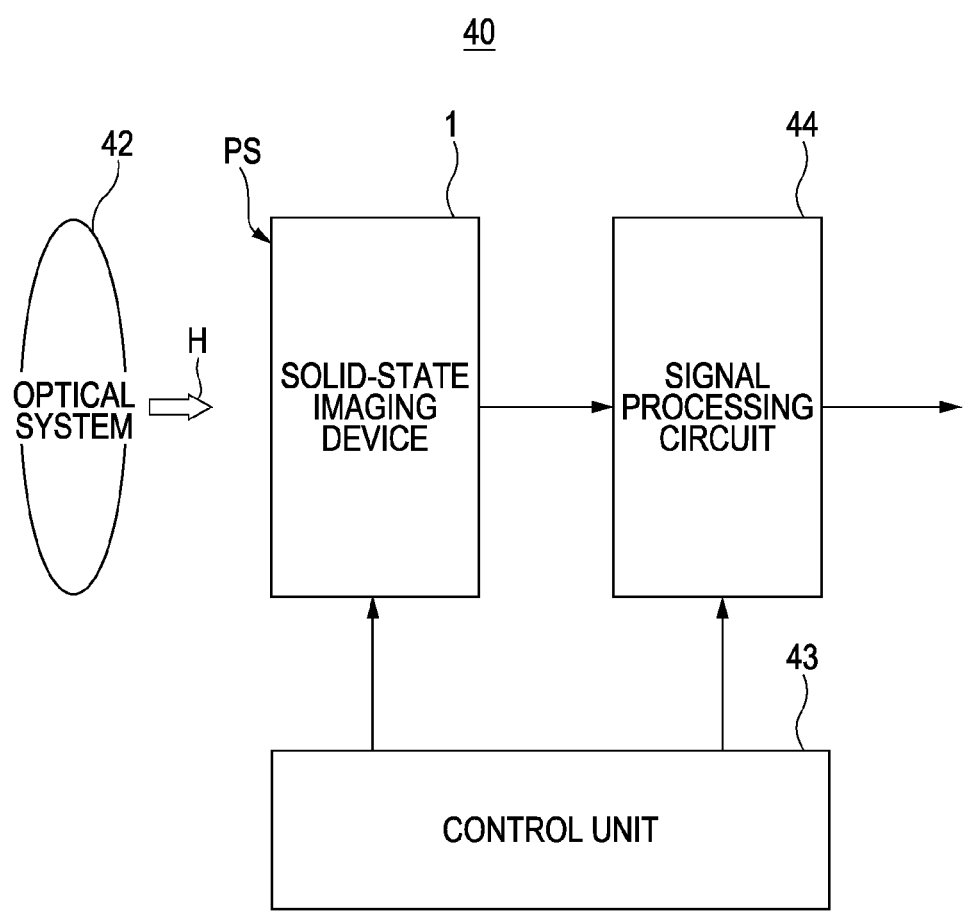
FIG. 1 is a block diagram illustrating the configuration of a camera 40 according to a first embodiment of the present invention.

As shown in FIG. 1, the camera 40 includes a solid-state imaging device 1, an optical system 42, a control unit 43, and a signal processing circuit 44. Each unit will be described in sequence.

The solid-state imaging device 1 receives light (subject image) that enters through the optical system 42 from an image-capturing plane PS, and photoelectrically converts the light, thereby generating signal charge. Here, the solid-state imaging device 1 is driven in accordance with a control signal output from the control unit 43. More specifically, the solid-state imaging device 1 reads the signal charge and outputs it as raw data.

The optical system 42 includes optical members, such as image-forming lenses and an aperture, and is arranged in such a manner that incident light H from a subject image is collected onto the image-capturing plane PS of the solid-state imaging device 1.

The control unit 43 outputs various control signals to the solid-state imaging device 1 and the signal processing circuit 44, so that the solid-state imaging device 1 and the signal processing circuit 44 are controlled to be driven.

The signal processing circuit 44 is configured in such a manner that, by performing signal processing on an electrical signal output from the solid-state imaging device 1, a digital image is generated with regard to the subject image.

(1-2) Configuration of Main Portion of Solid-State Imaging Device

The overall configuration of the solid-state imaging device 1 will be described.

Figure 2:
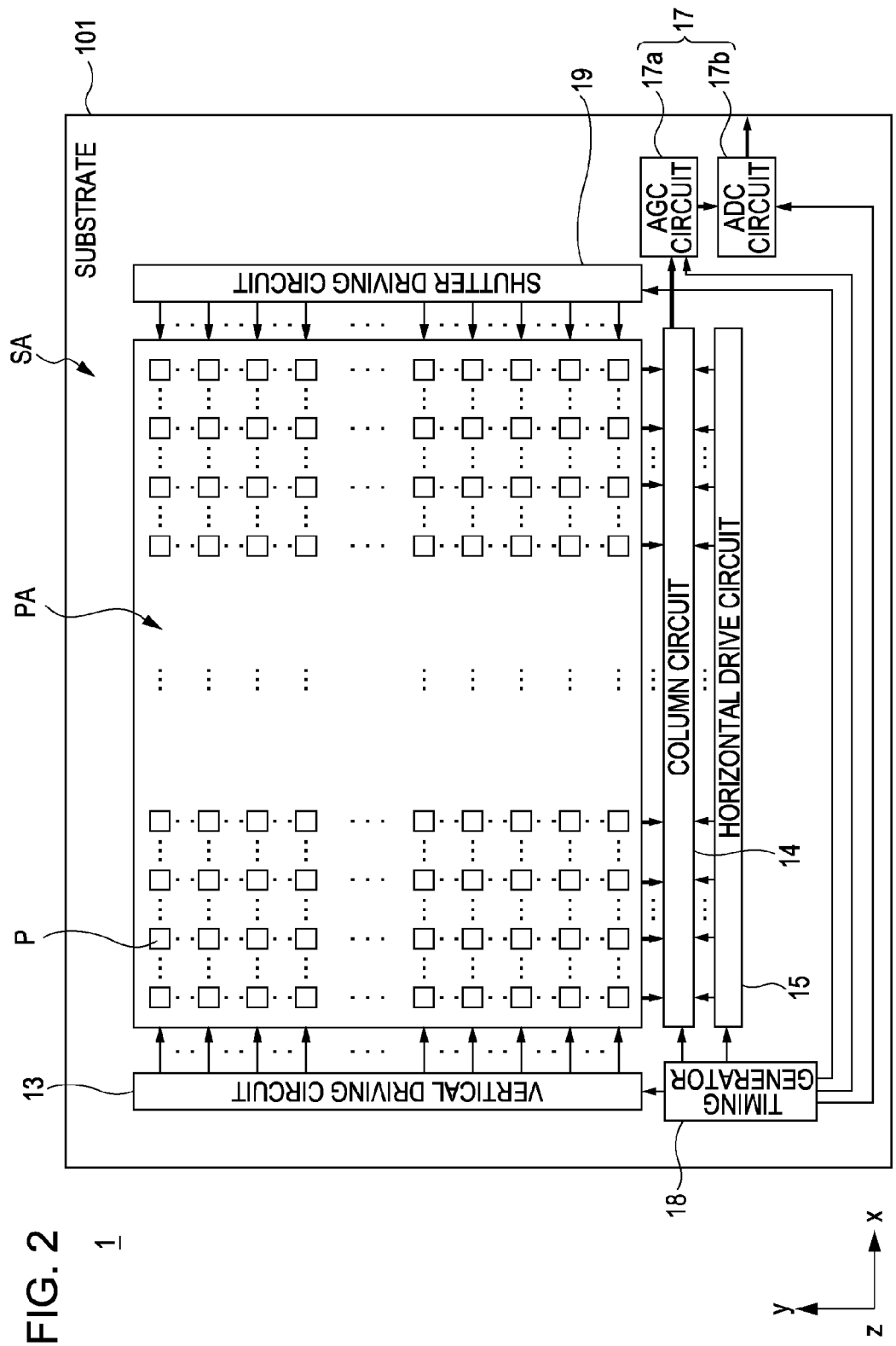
FIG. 2 is a block diagram illustrating the overall configuration of a solid-state imaging device 1 according to the first embodiment of the present invention.

FIG. 2 is a block diagram illustrating the overall configuration of the solid-state imaging device 1 according to the first embodiment of the present invention.

The solid-state imaging device 1 according to the present embodiment is a CMOS image sensor, and includes a substrate 101, as shown in FIG. 2. This substrate 101 is, for example, a semiconductor substrate formed from silicon. As shown in FIG. 2, the substrate 101 is provided with a pixel area PA and a peripheral portion SA.

As shown in FIG. 2, the pixel area PA is in the shape of a rectangle, with a plurality of pixels P being arranged in the horizontal direction x and in the vertical direction y. That is, the pixels P are arranged in a matrix. Then, the pixel area PA is arranged in such a manner that the center thereof corresponds to the optical axis of the optical system 42 shown in FIG. 1.

In the pixel area PA, the pixels P are configured to receive incident light and generate signal charge. Then, the generated signal charge is read and output by a pixel transistor (not shown). In the pixel area PA, the upper side of the light-receiving surface thereof is opened, and the pixel P that receives incident light that enters as a subject image is arranged as a so-called effective pixel, thereby performing image capturing. The detailed configuration of the pixel P will be described later.

As shown in FIG. 2, the peripheral portion SA is positioned in the surroundings of the pixel area PA. In this peripheral portion SA, a peripheral circuit is provided.

More specifically, as shown in FIG. 2, a vertical driving circuit 13, a column circuit 14, a horizontal driving circuit 15, an external output circuit 17, a timing generator (TG) 18, and a shutter driving circuit 19 are provided as peripheral circuits.

As shown in FIG. 2, the vertical driving circuit 13 is provided in the side part of the pixel area PA in the peripheral portion SA, and is configured in such a manner that the pixels P of the pixel area PA are selected in units of rows so as to be driven.

As shown in FIG. 2, the column circuit 14 is provided in the lower end portion of the pixel area PA in the peripheral portion SA, and performs signal processing on signals output from the pixels P in units of columns. Here, the column circuit 14 includes a correlated double sampling (CDS) circuit (not shown), and performs signal processing for removing fixed pattern noise.

As shown in FIG. 2, the horizontal driving circuit 15 is electrically connected to the column circuit 14. The horizontal driving circuit 15 includes, for example, a shift register, and sequentially outputs signals held for each column of the pixels P in the column circuit 14 to the external output circuit 17.

As shown in FIG. 2, the external output circuit 17 is electrically connected to the column circuit 14, performs signal processing on a signal output from the column circuit 14, and thereafter outputs the signal to the outside. The external output circuit 17 includes an AGC (Automatic Gain Control) circuit 17a and an ADC circuit 17b. In the external output circuit 17, after the AGC circuit 17a applies a gain to the signal, the ADC circuit 17b converts the signal from the analog signal into a digital signal, and outputs it to the outside.

As shown in FIG. 2, the timing generator 18 is electrically connected to the vertical driving circuit 13, the column circuit 14, the horizontal driving circuit 15, the external output circuit 17, and the shutter driving circuit 19. The timing generator 18 generates various timing signals, and outputs the signals to the vertical driving circuit 13, the column circuit 14, the horizontal driving circuit 15, the external output circuit 17, and the shutter driving circuit 19, so that each unit is driven and controlled.

The shutter driving circuit 19 is configured to select the pixels P in units of rows so as to adjust the exposure time period in the pixel P.

(1-3) Detailed Configuration of Solid-State Imaging Device

The details of the solid-state imaging device according to the present embodiment will be described below.

Figure 3:
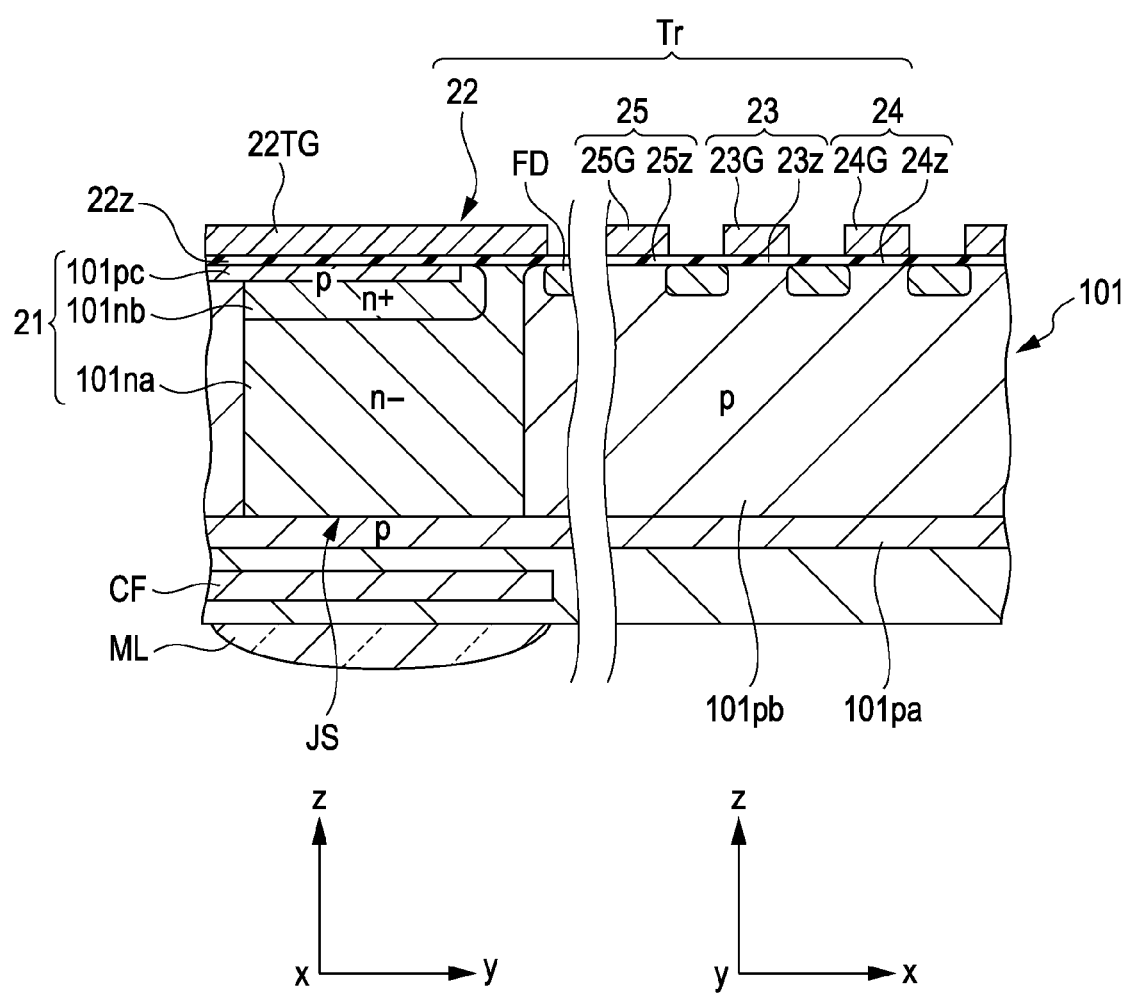
FIG. 3 illustrates the main portion of the solid-state imaging device according to the first embodiment of the present invention.
Figure 4:
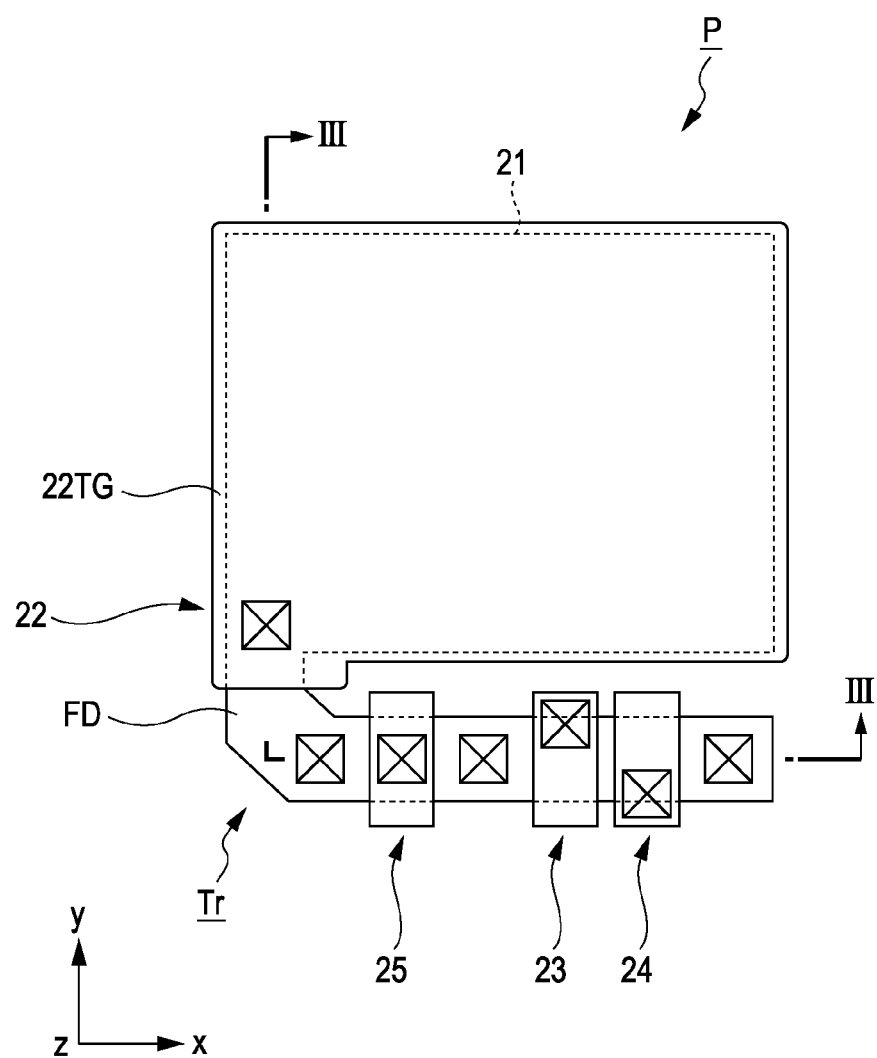
FIG. 4 illustrates the main portion of the solid-state imaging device according to the first embodiment of the present invention.
Figure 5:
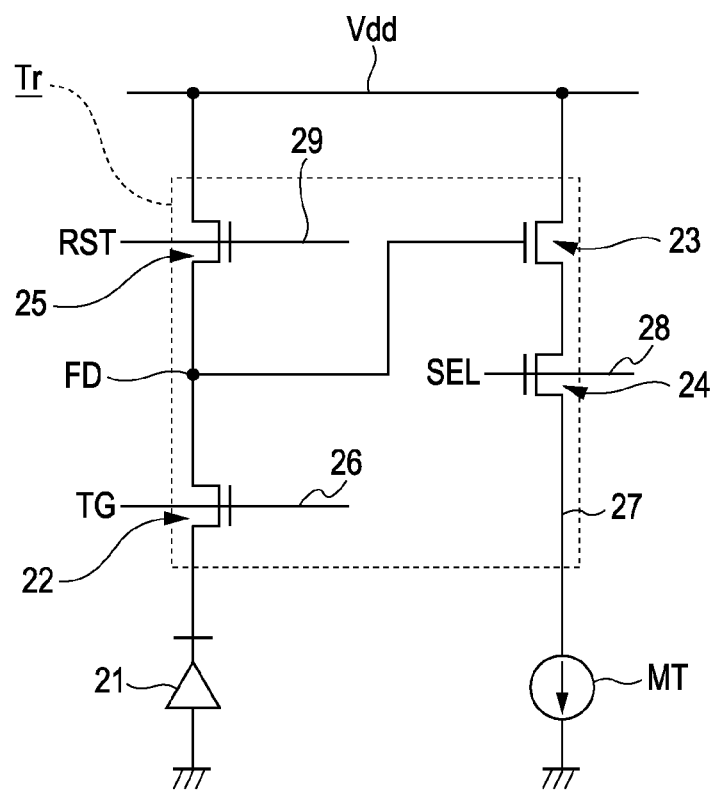
FIG. 5 illustrates the main portion of the solid-state imaging device according to the first embodiment of the present invention.

FIGS. 3 to 5 illustrate the main portion of the solid-state imaging device according to the first embodiment of the present invention.

FIG. 3 illustrates the cross section of the pixel P. FIG. 4 illustrates the top surface of the pixel P. FIG. 5 illustrates the circuit configuration of the pixel P.

As shown in the figures, the solid-state imaging device 1 includes a photodiode 21 and a pixel transistor Tr. Here, the pixel transistor Tr is configured to include a transfer transistor 22, an amplification transistor 23, a selection transistor 24, and a reset transistor 25, and read signal charge from the photodiode 21.

In the present embodiment, as shown in FIG. 3, the solid-state imaging device 1 is provided with a pixel transistor Tr, such as a transfer transistor 22, on the top surface of the substrate 101. Then, on the top surface of the substrate 101, a wiring layer (not shown) is provided in such a manner as to cover the pixel transistor Tr. On the bottom surface side opposite to the top surface side, incident light H is received by a light-receiving surface JS. That is, the solid-state imaging device 1 according to the present embodiment is a "bottom surface irradiation type CMOS image sensor" of 4 Tr-type.

Each unit will be described in sequence.

(a) Photodiode 21

In the solid-state imaging device 1, a plurality of photodiodes 21 are arranged in such a manner as to correspond to the plurality of pixels P shown in FIG. 2. That is, in the image-capturing plane (xy plane), the plurality of photodiodes 21 are provided side by side in the horizontal direction x and in the vertical direction y at right angles to the horizontal direction x.

The photodiode 21 is configured to receive incident light (subject image) and photoelectrically converts the light, thereby generating signal charge and storing it.

As shown in FIG. 3, the photodiode 21 is provided, for example, within a substrate 101, which is a silicon semiconductor. More specifically, the photodiode 21 includes n-type charge storage areas 101na and 101nb, with the n-type charge storage areas 101na and 101nb being provided in p-type semiconductor areas 101pa and 101pb of the substrate 101.

That is, the p-type semiconductor area 101pa and the n-type charge storage areas 101na and 101nb are sequentially formed from the reverse surface side (in FIG. 3, the bottom surface) toward the obverse surface side (in FIG. 3, the top surface) in the substrate 101.

Then, in the n-type charge storage areas 101na and 101nb on the top surface of the substrate 101, a p-type semiconductor area 101pc whose impurity concentration is higher than that in the p-type semiconductor areas 101pa and 101pb is provided as a hole accumulation layer. That is, the high-concentration p-type semiconductor area 101pc is formed nearer the surface than the n-type charge storage areas 101na and 101nb in the substrate 101 are.

Then, as shown in FIGS. 3 to 5, each photodiode 21 is configured to cause the stored signal charge to be transferred to a floating diffusion FD by the transfer transistor 22.

(b) Pixel Transistor Tr

In the solid-state imaging device 1, a plurality of pixel transistors Tr are arranged in such a manner as to correspond to the plurality of pixels P shown in FIG. 2. As shown in the figures, as the pixel transistors Tr, the transfer transistor 22, the amplification transistor 23, the selection transistor 24, and the reset transistor 25 are provided.

Each of the transistors 22 to 25 constituting the pixel transistor Tr is provided on the top surface side of the substrate 101, as shown in FIG. 3. Each of the transistors 22 to 25 is provided in such a manner as to be positioned on the lower side of the photodiode 21 in the image-capturing plane (xy plane), as shown in FIG. 4. For example, an area that separates between the pixels P in the substrate 101 is formed with an active area (not shown), and each gate is formed by using polysilicon containing an n-type impurity. The gate may be formed by using polysilicon containing a p-type impurity.

(b-1) Transfer Transistor 22

In the pixel transistor Tr, the transfer transistor 22 is provided on the top surface of the substrate 101, as shown in FIG. 3. As shown in FIGS. 4 and 5, the transfer transistor 22 is configured to output the signal charge generated in the photodiode 21 as an electrical signal to the gate of the amplification transistor 23. More specifically, the transfer transistor 22, by being supplied with a transfer signal to the gate thereof from the transfer line 26, transfers the signal charge stored in the photodiode 21 to the floating diffusion FD. In the floating diffusion FD, the signal is converted from electric charge into a voltage, and is input as an electrical signal to the gate of the amplification transistor 23.

Here, in the transfer transistor 22, as shown in FIG. 3, a transfer gate electrode 22TG is provided on the surface of the substrate 101 with a gate insulating film 22z in between. In the transfer transistor 22, the transfer gate electrode 22TG is provided in such a manner as to be adjacent to the floating diffusion FD provided on the surface of the substrate 101. Here, the transfer gate electrode 22TG is provided with the gate insulating film 22z in between in the channel formed area of the transfer transistor 22 that transfers the signal charge from the photodiode 21 to the floating diffusion FD.

In the present embodiment, in addition to the above, the transfer gate electrode 22TG is provided in such a manner as to cover the photodiode 21, as shown in FIGS. 3 and 4. That is, on the top surface of the substrate 101, the transfer gate electrode 22TG is provided in such a manner as to extend from the upper side of the channel formed area of the transfer transistor 22 to the upper side of the photodiode 21 with the gate insulating film 22z in between.

(b-2) Amplification Transistor 23

In the pixel transistor Tr, as shown in FIG. 3, the amplification transistor 23 is provided on the top surface of the substrate 101. Then, as shown in FIGS. 4 and 5, the amplification transistor 23 is configured to amplify and output the electrical signal that has been converted from electric charge into a voltage in the floating diffusion FD. More specifically, the gate of the amplification transistor 23 is connected to the floating diffusion FD. Furthermore, the drain of the amplification transistor 23 is connected to the power-supply line Vdd, and the source thereof is connected to the selection transistor 24. When the selection transistor 24 is selected so as to be turned on, the amplification transistor 23 is supplied with constant current from a constant current source (not shown) and operates as a source follower. For this reason, in the amplification transistor 23, as a result of a selection signal being supplied to the selection transistor 24, an electrical signal that has been converted from electric charge to a voltage is amplified in the floating diffusion FD.

Here, in the amplification transistor 23, as shown in FIG. 3, a gate electrode 25G is provided on the surface of the substrate 101 with a gate insulating film 25z in between. As shown in FIGS. 3 and 4, this amplification transistor 23 is provided between the selection transistor 24 and the reset transistor 25, which are provided on the surface of the substrate 101.

(b-3) Selection Transistor 24

In the pixel transistor Tr, as shown in FIG. 3, the selection transistor 24 is provided on the top surface of the substrate 101. Then, as shown in FIGS. 4 and 5, when the selection signal is input, the selection transistor 24 is configured to output the electrical signal output by the amplification transistor 23 to the vertical signal line 27. More specifically, as shown in FIG. 5, the gate of the selection transistor 24 is connected to an address line 28 to which the selection signal is supplied. Then, the selection transistor 24 is turned on when the selection signal is supplied, and outputs an output signal that has been amplified by the amplification transistor 23 in the manner described above to the vertical signal line 27.

Here, in the selection transistor 24, as shown in FIG. 3, a gate electrode 24G is provided on the surface of the substrate 101 with a gate insulating film 24z in between. As shown in FIGS. 3 and 4, this selection transistor 24 is provided in such a manner as to be adjacent to the amplification transistor 23 provided on the surface of the substrate 101.

(b-4) Reset Transistor 25

In the pixel transistor Tr, as shown in FIG. 3, the reset transistor 25 is provided on the top surface of the substrate 101. Then, as shown in FIGS. 4 and 5, the reset transistor 25 is configured to reset the gate voltage of the amplification transistor 23. More specifically, as shown in FIG. 5, the gate of the reset transistor 25 is connected to a reset line 29 to which a reset signal is supplied. Furthermore, the drain of the reset transistor 25 is connected to the power-supply line Vdd, and the source thereof is connected to the floating diffusion FD. When a reset signal is supplied to the gate from the reset line 29, the reset transistor 25 resets the gate voltage of the amplification transistor 23 to the power-supply voltage through the floating diffusion FD.

Here, as shown in FIG. 3, in the reset transistor 25, the gate electrode 25G is provided on the surface of the substrate 101 with the gate insulating film 25z in between. As shown in FIGS. 3 and 4, this reset transistor 25 is provided in such a manner as to be adjacent to the amplification transistor 23 provided on the surface of the substrate 101.

(c) Others

In addition, as shown in FIG. 3, the bottom surface side of the substrate 101 is provided with a color filter CF and a microlens ML in such a manner as to correspond to the pixel P. The color filter CF is formed in Bayer arrangement in such a manner that filter layers of each color are arranged.

Although the illustration is omitted, on the surface of the substrate 101, a wiring layer (not shown) is provided in such a manner as to cover the pixel transistor Tr. In this wiring layer, wiring that is electrically connected to each element is formed within the insulating layer. Each wiring is formed in such a manner as to be stacked to function as wiring, such as the transfer line 26, the address line 28, the vertical signal line 27, and the reset line 29, which are shown in FIG. 5.

(2) Manufacturing Method

The main portion of a method of manufacturing the solid-state imaging device 1 will be described.

FIGS. 6 to 9 illustrate a method of manufacturing a solid-state imaging device in the first embodiment of the present invention.

Here, similarly to FIG. 3, FIGS. 6 to 9 illustrate cross sections. By sequentially undergoing each step shown in FIGS. 6 to 9, the solid-state imaging device 1 shown in FIG. 3, etc., is manufactured.

(2-1) Formation of p-Type Semiconductor Areas 101*pa* and 101*pb*, and the Like

Figure 6:
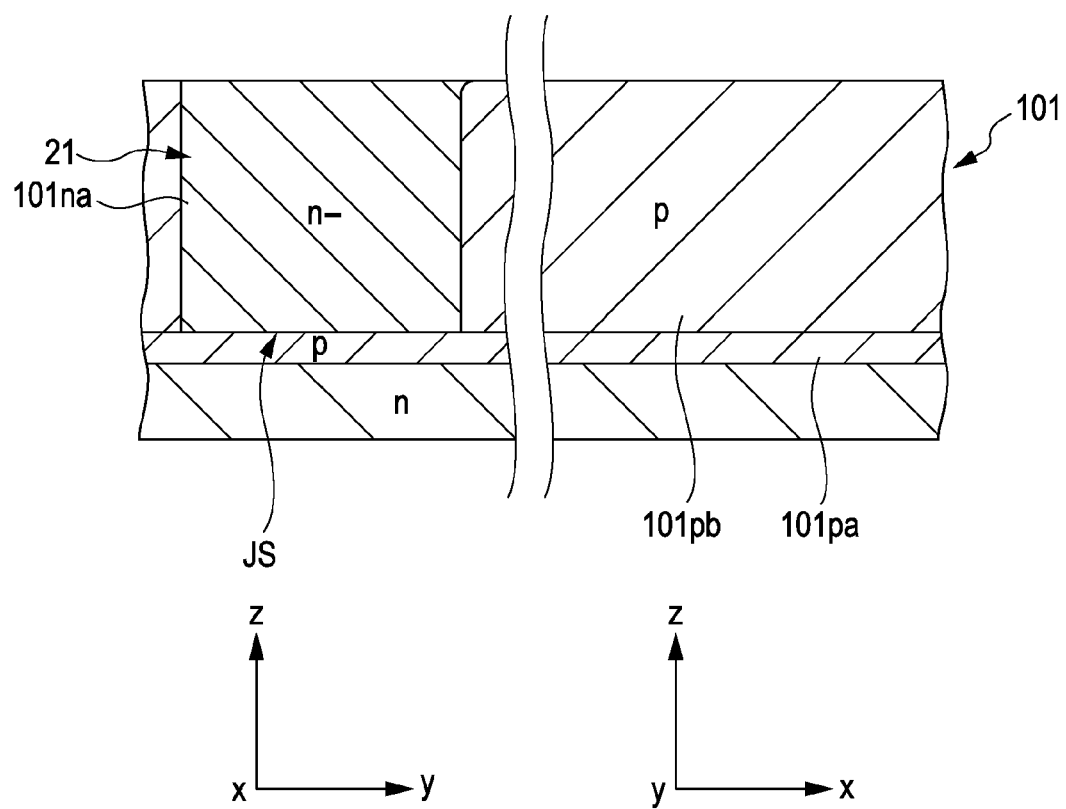
FIG. 6 illustrates a method of manufacturing a solid-state imaging device according to the first embodiment of the present invention.

First, as shown in FIG. 6, the p-type semiconductor areas 101*pa* and 101*pb* and the like are formed.

Here, for example, after an n-type silicon semiconductor substrate is prepared as the substrate 101, the p-type semiconductor areas 101*pa* and 101*pb* and the n-type charge storage area 101*na* are formed on the substrate 101.

For example, the areas 101*pa*, 101*pb*, and 101*na* are formed so that these fall within the range of the impurity concentration, such as those shown below. More specifically, by ion-implanting an impurity, the areas 101*pa*, 101*pb*, and 101*na* are formed.

P-Type Semiconductor Areas 101*pa* and 101*pb*
Impurity concentration: $1\times10^{16}$ to $1\times10^{18}$ cm$^{-3}$ (preferably, $5\times10^{16}$ to $5\times10^{17}$ cm$^{-3}$).

N-Type Charge Storage Area 101*na*
Impurity concentration: $1\times10^{15}$ to $1\times10^{17}$ cm$^{-3}$ (preferably, $5\times10^{15}$ to $5\times10^{16}$ cm$^{-3}$).

(2-2) Formation of Photodiode 21

Figure 7:
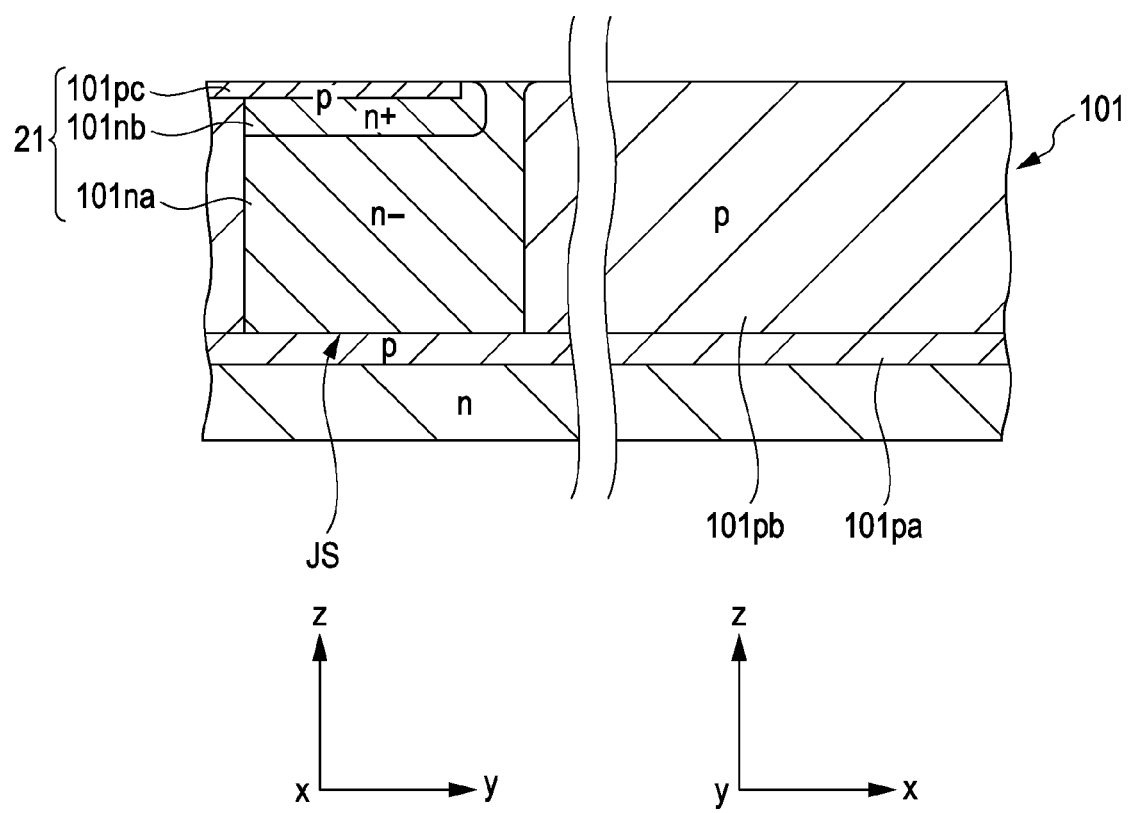
FIG. 7 illustrates a method of manufacturing the solid-state imaging device according to the first embodiment of the present invention.

Next, as shown in FIG. 7, an n-type charge storage area 101*nb* and a p-type semiconductor area 101*pc* are provided to form a photodiode 21.

Here, in the n-type charge storage area 101*na*, the n-type charge storage area 101*nb* is provided in a shallow portion on the top surface side. Furthermore, in the n-type charge storage area 101*nb*, a p-type semiconductor area 101*pc* is provided in a shallow portion on the top surface side.

For example, the areas 101*nb* and 101*pc* are formed so that these fall within the range of the impurity concentration, such as those shown below. More specifically, by ion-implanting an impurity, the areas 101*pa*, 101*pb*, and 101*na* are formed.

N-Type Charge Storage Area 101*nb*
Impurity concentration: $1\times10^{16}$ to $1\times10^{18}$ cm$^{-3}$ (preferably, $5\times10^{16}$ to $5\times10^{17}$ cm$^{-3}$).

P-Type Semiconductor Area 101*pc*
Impurity concentration: $1\times10^{17}$ to $1\times10^{19}$ cm$^{-3}$ (preferably, $5\times10^{17}$ to $5\times10^{18}$ cm$^{-3}$)

(2-3) Formation of Insulating Film 20*z* and Polysilicon Film 20S

Figure 8:
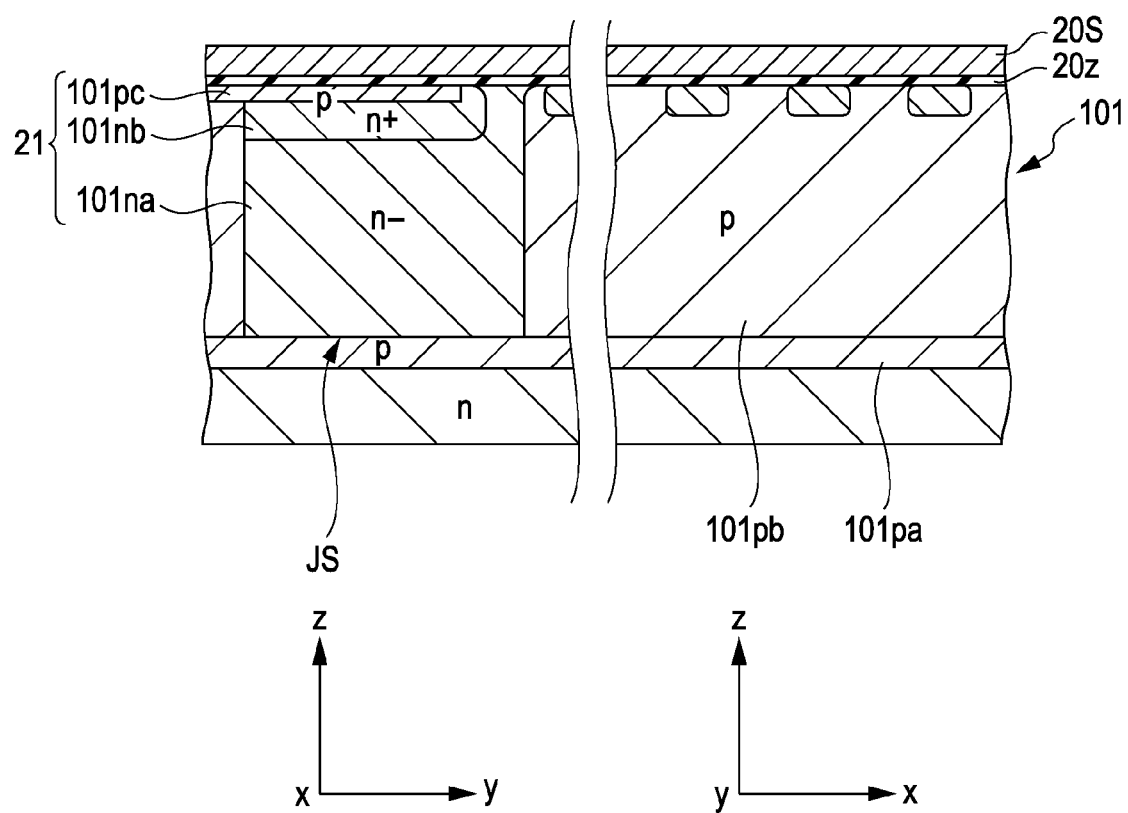
FIG. 8 illustrates a method of manufacturing the solid-state imaging device according to the first embodiment of the present invention.

Next, as shown in FIG. 8, the insulating film 20*z* and the polysilicon film 20S are formed.

Here, after the insulating film 20*z* of a silicon oxide film is formed on the surface of the substrate 101, the polysilicon film 20S is formed. The insulating film 20*z* and the polysilicon film 20S are formed in such a manner as to cover the area in which the gate of each of the transistors 22, 23, 24, and 25 forming the pixel transistor Tr is formed.

More specifically, by performing a thermal oxidation process on the surface of the substrate 101, the insulating film 20*z* of a silicon oxide film is formed. Then, for example, the polysilicon film 20S is formed by a CVD process.

(2-4) Formation of Pixel Transistor Tr

Figure 9:
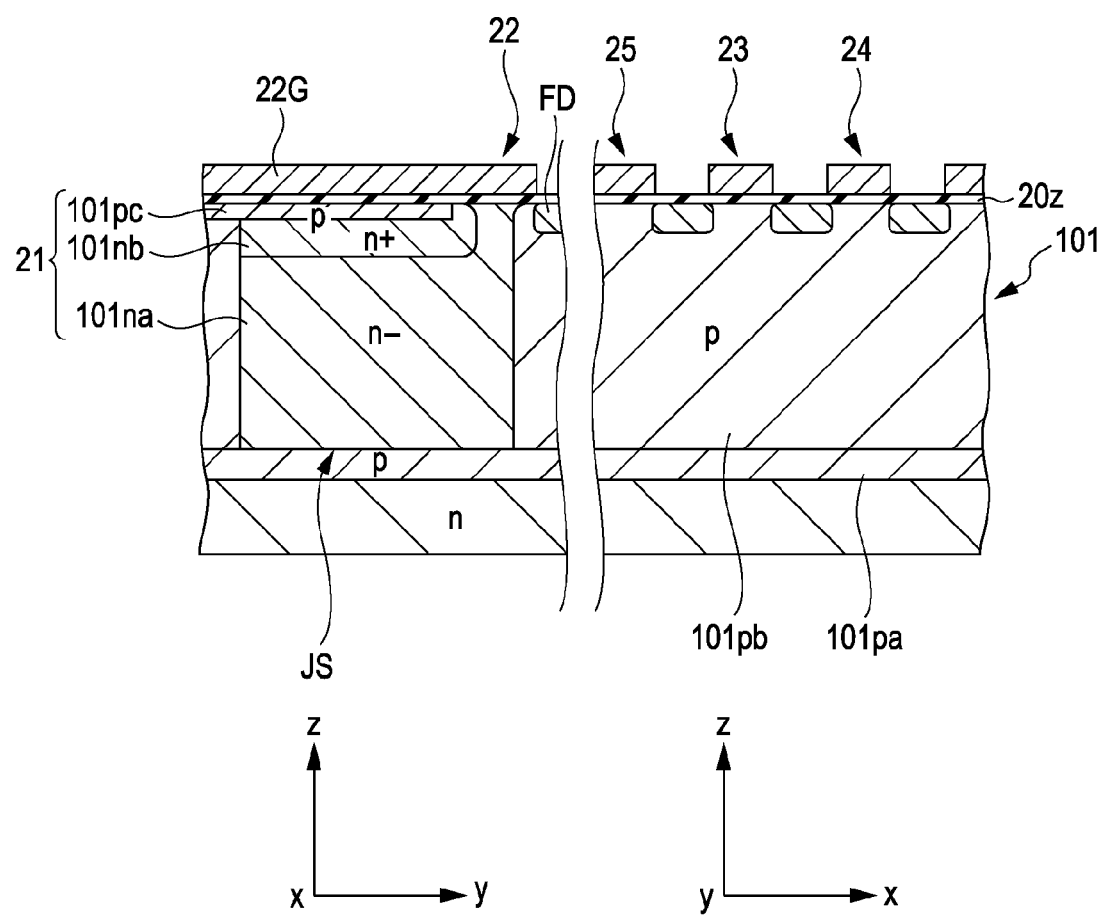
FIG. 9 illustrates a method of manufacturing the solid-state imaging device according to the first embodiment of the present invention.

Next, as shown in FIG. 9, the transistors 22, 23, 24, and 25 forming the pixel transistor Tr are formed.

Here, by performing pattern processing on the polysilicon film 20S (see FIG. 8), the gate of each of the transistors 22, 23, 24, and 25 is formed. More specifically, a resist pattern (not shown) is provided on the polysilicon film 20S by a photolithographic technology in such a manner as to correspond to the pattern of the gate of each of the transistors 22, 23, 24, and 25. Then, by performing an etching process on the polysilicon film 20S by using the resist pattern (not shown) as a mask, the gate of each of the transistors 22, 23, 24, and 25 is formed from the polysilicon film 20S.

Then, the source and the drain (including the floating diffusion FD) of each of the transistors 22, 23, 24, and 25 are formed. For example, the source and the drain of each of the transistors 22, 23, 24, and 25 are formed so that those fall within the range of the impurity concentration, such as those shown below.

Source and Drain of Each of Transistors 22, 23, 24, and 25
Impurity concentration: $1\times10^{19}$ cm$^{-3}$ or higher Thereafter, after a wiring layer (not shown) is provided, a backup substrate (not shown) is bonded on the top surface of the wiring layer. Then, after the substrate 101 is reversed, a thinning film process is performed on the substrate 101. For example, by performing a CMP process as a thinning film process, a portion of the substrate 101 is removed from the bottom surface side.

Then, as shown in FIG. 3, on the bottom surface side of the substrate 101, a color filter (not shown) and an on-chip lens (not shown) are provided. As a result of the above, a bottom surface irradiation type CMOS image sensor is completed.

(3) Operation

The operation of the solid-state imaging device 1 will be described.

Figure 10:
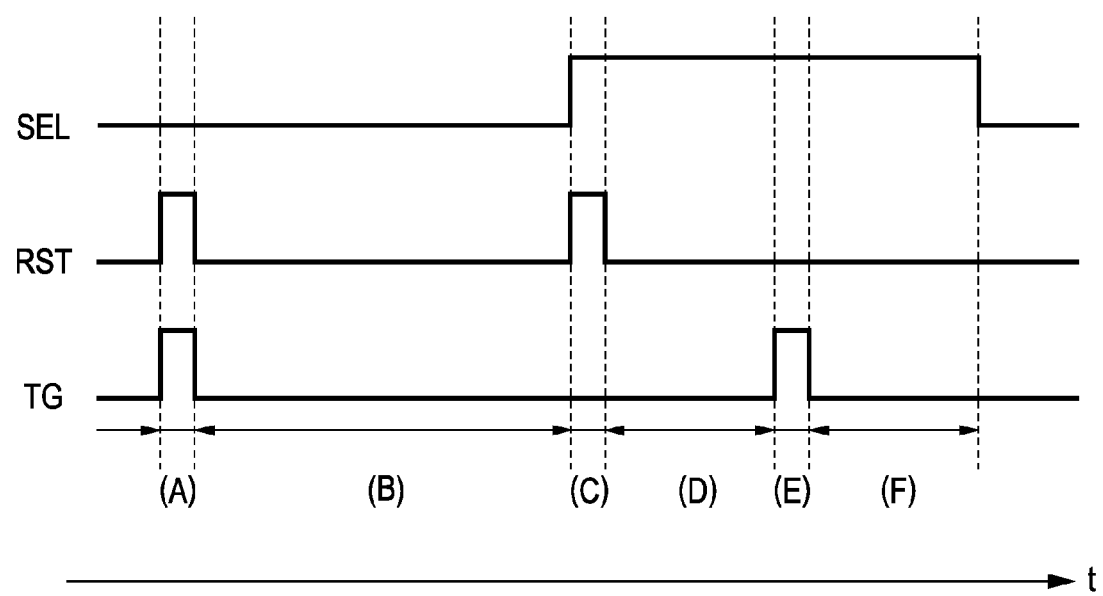
FIG. 10 illustrates the operation of the solid-state imaging device according to the first embodiment of the present invention.
Figure 11:
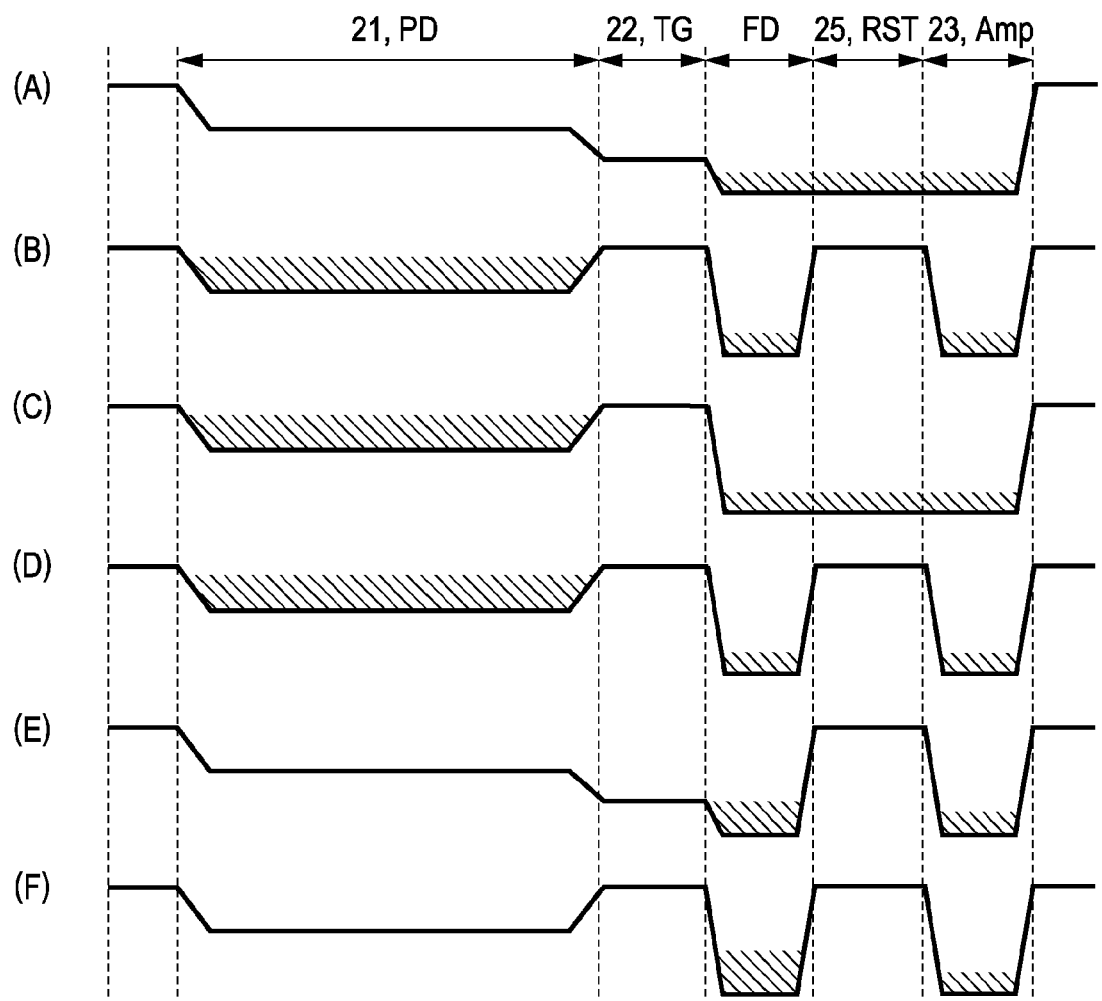
FIG. 11 illustrates the operation of the solid-state imaging device according to the first embodiment of the present invention.

FIGS. 10 and 11 illustrate the operation of the solid-state imaging device in the first embodiment of the present invention.

FIG. 10 is a timing chart illustrating a pulse signal that is supplied to each unit when a signal is to be read from the pixel P. In FIG. 10, "SEL" indicates a "selection signal" to be input to the gate of the selection transistor 24. "RST" indicates a "reset signal" to be input to the gate of the reset transistor 25. "TG" indicates a "transfer signal" to be input to the gate (transfer gate electrode 22TG) of the transfer transistor 22. In FIG. 10, part (A) indicates a "shutter period", part (B) indicates a "storage period", part (C) indicates a "reset period", part (D) indicates a reset level read period, part (E) indicates a "transfer period", and part (F) indicates a "signal level read period".

FIG. 11 illustrates a potential view of each of the units (21 to 24, FD, etc.) that operate in each of the periods (A) to (F) of FIG. 10.

(A) "Shutter Period"

When the solid-state imaging device 1 is to be operated, first, as shown in FIG. 10, in the "shutter period" of part (A), a shutter operation is performed.

In this "shutter period" of part (A), as shown in FIG. 10, the reset transistor 25 and the transfer transistor 22 are turned on in a state in which the selection transistor 24 is off.

As a result, as shown in part (A) of FIG. 11, on the substrate 101, potentials of the reset transistor 25 portion and the transfer transistor 22 portion vary, and a shutter operation is performed.

(B) "Storage Period"

Next, as shown in FIG. 10, an accumulation operation is performed in the "storage period" of part (B).

In this "storage period" of part (B), as shown in FIG. 10, the reset transistor 25 and the transfer transistor 22 that have been on in the "shutter period" of part (A) are turned off. That is, in a state in which the selection transistor 24 is off, the reset transistor 25 and the transfer transistor 22 are turned off.

As a result, as shown in part (B) of FIG. 11, on the substrate 101, the potentials in the reset transistor 25 portion and the transfer transistor 22 portion vary from the case of the "shutter period" of part (A), and an accumulation operation is performed. That is, light enters the photodiode 21, causing signal charge to be generated and stored in the potential well (the diagonal line portion of part (B) of FIG. 11).

(C) "Reset Period"

Next, as shown in FIG. 10, a reset operation is performed in the "reset period" of part (C).

In this "reset period" of part (C), as shown in FIG. 10, the selection transistor 24 and the reset transistor 25 that have been off in the "storage period" of part (B) are turned on. That is, while the reset transistor 25 is turned on in a state in which the selection transistor 24 is on, the transfer transistor 22 is kept to be off.

As a result, as shown in part (C) of FIG. 11, on the substrate 101, the potential of the reset transistor 25 portion varies from the case of the "storage period" of part (B), and a reset operation is performed. That is, the reset transistor 25 is turned on, and the floating diffusion FD is reset to the power-supply voltage Vdd.

(D) "Reset Level Read Period"

Next, as shown in FIG. 10, in the "reset level read period" of part (D), a read reset level operation is performed.

In this "reset level read period" of part (D), as shown in FIG. 10, the reset transistor 25 that has been on in the "reset period" of part (C) is turned off. That is, in a state in which the selection transistor 24 is on, the reset transistor 25 and the transfer transistor 22 are turned off.

As a result, as shown in part (D) of FIG. 11, on the substrate 101, the potential of the reset transistor 25 portion varies from the case of the "reset period" of part (C). Then, in this period, a read reset level operation is performed. That is, a voltage corresponding to the reset level is read to the column circuit 14.

(E) "Transfer Period"

Next, as shown in FIG. 10, in the "transfer period" of part (E), a transfer operation is performed.

In this "transfer period" of part (E), as shown in FIG. 10, the transfer transistor 22 that has been off in the "reset level read period" of part (D) is turned on. That is, in a state in which the selection transistor 24 is on, while the transfer transistor 22 is placed in an on state, the reset transistor 25 is kept to be off.

As a result, as shown in part (E) of FIG. 11, on the substrate 101, the potential of the transfer transistor 22 portion varies from the case of the "reset level read period" of part (D). Then, in this period, a transfer operation is performed. That is, the transfer transistor 22 is brought into a conductive state, and the signal charge accumulated in the photodiode 21 is transferred to the gate of the amplification transistor 23.

(F) "Signal Level Read Period"

Next, as shown in FIG. 10, in the "signal level read period" of part (F), an operation of reading and transferring a signal level is performed.

In the "signal level read period" of part (F), as shown in FIG. 10, the transfer transistor 22 that has been on in the "transfer period" of part (E) is turned off. That is, in a state in which the selection transistor 24 is on, the transfer transistor 22 and the reset transistor 25 are turned off.

As a result, as shown in part (F) of FIG. 11, on the substrate 101, the potential of the transfer transistor 22 portion varies from the case of the "transfer period" of part (E). Then, in this period, an operation of reading and transferring a signal level is performed. That is, after the transfer transistor 22 is made to be in a non-conductive state, a voltage corresponding to the amount of the transferred signal charge is read to the column circuit 14.

In the column circuit 14, a differential process is performed between the reset level that was read earlier and the signal level that was read later, and the result is held. As a result, fixed pattern noise that is generated due to variations in Vth of each transistor provided for each pixel P is cancelled.

The gates of the transistors 22, 24, and 25 are connected in units of rows formed of a plurality of pixels arranged in the horizontal direction x. Thus, the operation for driving the pixels P in the manner described above is performed simultaneously with regard to the plurality of pixels arranged in units of rows. More specifically, the pixels P are sequentially selected in the vertical direction in units of horizontal lines (pixel rows) in accordance with the selection signal supplied by the above-mentioned vertical driving circuit 13. Then, the transistors of the pixels are controlled in accordance with various timing signals output from the timing generator 18. As a result, the output signal in each pixel is read to the column circuit 14 for each pixel column through the vertical signal line 27.

Then, the signals held by the column circuit 14 are selected by the horizontal driving circuit 15 and are sequentially output to the external output circuit 17.

In the present embodiment, in the "storage period" of part (B), by applying a negative fixed potential (for example, −1 V) to the transfer gate electrode 22TG of the transfer transistor 22, the transfer transistor 22 is turned off. At this time, also, the transfer gate electrode 22TG provided on the photodiode 21 has this negative fixed electrical potential (for example, −1 V) applied thereto. For this reason, since holes are accumulated near the surface of the substrate 101, a reduction in dark current can be realized.

Then, in the "transfer period" of part (E), by applying a positive fixed electrical potential (for example, Vdd=3.3 V) to the transfer gate electrode 22TG of the transfer transistor 22, the transfer transistor 22 is turned on. At this time, also, the transfer gate electrode 22TG provided on the photodiode 21 is made to be in a state of having this positive fixed electrical potential (for example, Vdd=3.3 V) applied thereto.

In the present embodiment, the high-concentration p-type semiconductor area 101pc forming the photodiode 21 is configured to exist as an area that is not depleted in a case where a transfer signal of a positive fixed electrical potential is applied to the gate electrode 22TG (see FIG. 3, etc.). Therefore, in the "transfer period", since the electrical potential of the p-type semiconductor area 101pc does not vary, the potential of the photodiode 21 portion is maintained to be lower than the potential of the transfer transistor 22 portion, as shown in part (F) of FIG. 11. As a result of the above, it is possible to obtain an advantage in that the transfer efficiency is improved.

(4) Summary

As has been described above, in the present embodiment, a plurality of photodiodes 21 that receive light and generate signal charge are provided in such a manner as to correspond to a plurality of pixels P in the pixel area PA of the substrate 101. Then, the pixel transistor Tr that outputs the signal charge generated in the photodiode 21 as an electrical signal is provided on the surface of the substrate 101. On the substrate 101, this pixel transistor Tr is provided on the top surface opposite to the bottom surface on which the photodiode 21 receives light. Furthermore, the pixel transistor Tr includes a transfer transistor 22 that transfers the signal charge generated in the photodiode 21 to a floating diffusion FD corresponding to a drain. This transfer transistor 22 is formed in such a manner that the gate electrode 22TG extends with the gate insulating film 22z in between from the channel formed area to the portion where the photodiode 21 is formed on the top surface of the substrate 101.

In the present embodiment, the gate electrode 22TG of the transfer transistor 22 is formed from polysilicon, and contains either a p-type impurity or an n-type impurity. The gate electrode 22TG of the transfer transistor 22 is formed in such a manner that, on the top surface of the substrate 101, a polysilicon film 20S is formed in such a manner as to cover the area where the gate electrode 22TG of the transfer transistor 22 has been formed, and thereafter pattern processing is performed thereon (see FIG. 8).

The gate electrode 22TG of the transfer transistor 22, as described above, is subjected to pattern processing so that, on the surface of the substrate 101, the gate electrode 22TG extends from the channel formed area to the portion where the photodiode 21 has been formed. For this reason, the photodiode 21 does not directly receive damage due to the etching process performed at the time of this pattern processing. Therefore, since the occurrence of dark current, white spots, etc., resulting from damage by the etching process, can be suppressed, it is possible to improve the image quality of captured images.

Furthermore, in the formation of the gate electrode 22TG of the transfer transistor 22, it is not necessary to add other special steps. Consequently, the occurrence of problems, which leads to an increase in cost, can be prevented.

Furthermore, in the photodiode 21, on the top surface of the substrate 101, a p-type semiconductor area 101pc is provided as a hole accumulation layer. For this reason, since the design of the potential that completely transfers the carriers of the photodiode 21 is possible, the transfer efficiency of the photodiode 21 can be effectively improved.

2. Second Embodiment

(1) Device Configuration, Etc

Figure 12:
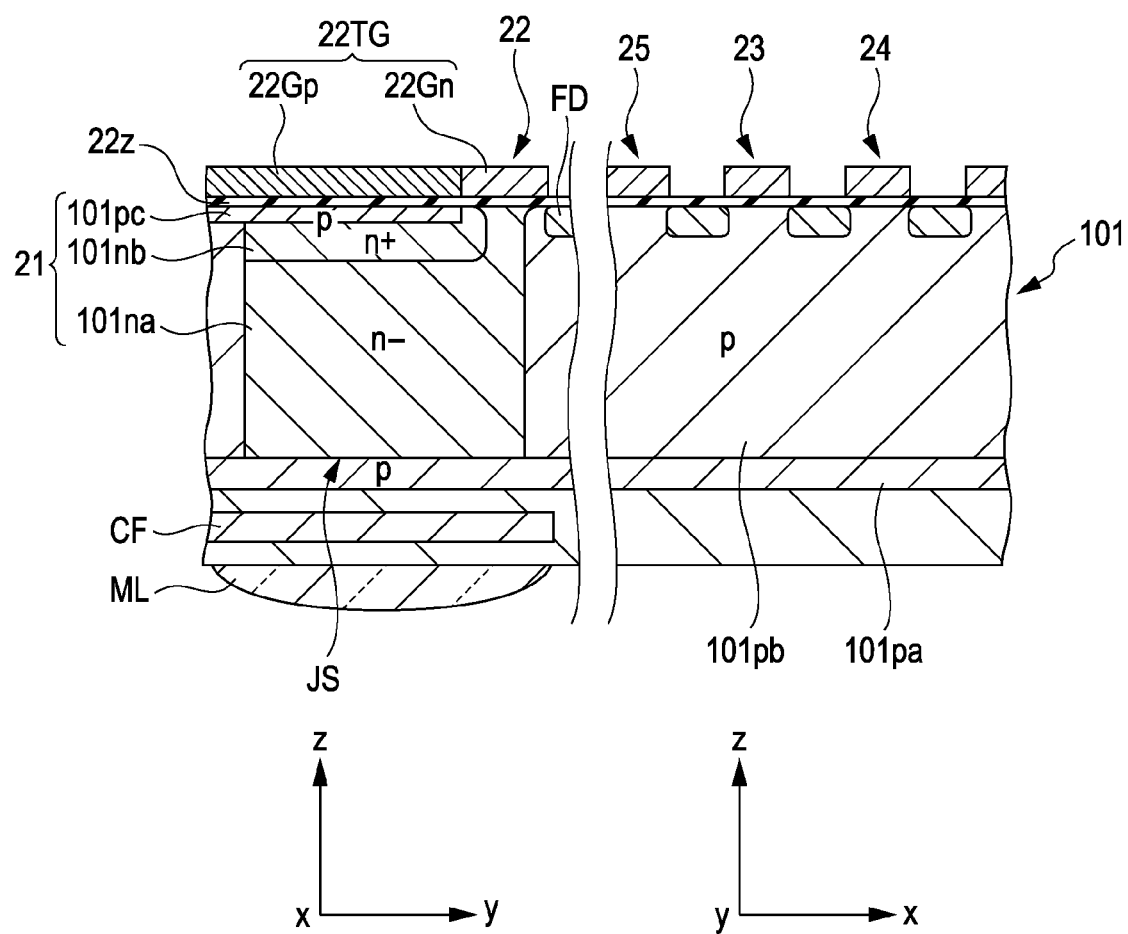
FIG. 12 illustrates the main portion of a solid-state imaging device according to a second embodiment of the present invention.
Figure 13:
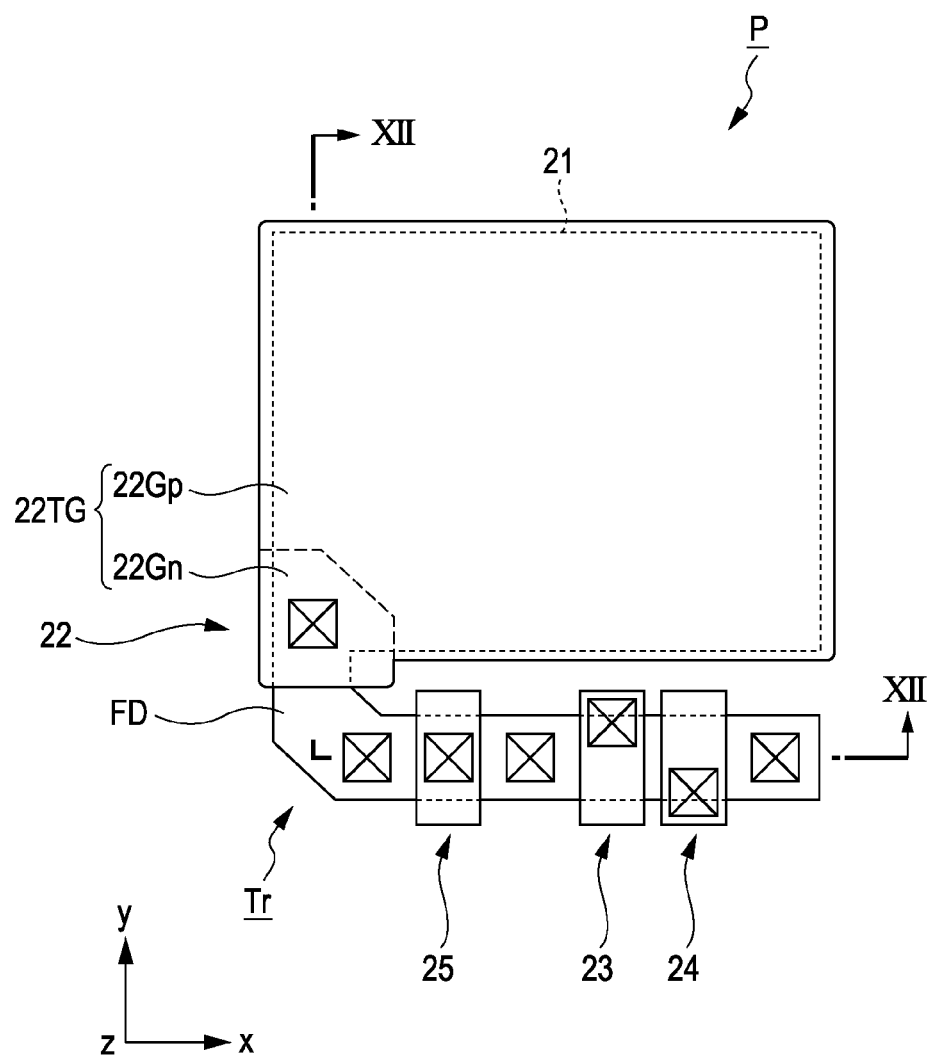
FIG. 13 illustrates the main portion of the solid-state imaging device according to the second embodiment of the present invention.

FIGS. 12 and 13 illustrate the main portion of a solid-state imaging device according to a second embodiment of the present invention.

Here, similarly to FIG. 3, FIG. 12 illustrates the cross section of a pixel P. Similarly to FIG. 4, FIG. 13 illustrates the top surface of the pixel P.

As shown in FIGS. 12 and 13, in the present embodiment, the transfer gate electrode 22TG forming transfer transistor 22 differs from the case of the first embodiment. The present embodiment is the same as the first embodiment except for this point. Accordingly, repeated description thereof is omitted.

As shown in FIGS. 12 and 13, similarly to the first embodiment, the transfer gate electrode 22TG is provided in such a manner as to cover the upper side of the photodiode 21. That is, on the surface of the substrate 101, the transfer gate electrode 22TG is provided in such a manner as to extend, with the gate insulating film 22z in between, from the upper side of the channel formed area of the transfer transistor 22 to the upper side of the photodiode 21.

However, in the present embodiment, unlike the first embodiment, the transfer gate electrode 22TG is configured to include an n-type part 22Gn and a p-type part 22Gp.

In the transfer gate electrode 22TG, the n-type part 22Gn is provided in such a manner as to be positioned in a portion containing an n-type impurity on the side of the floating diffusion FD, as shown in FIGS. 12 and 13.

Here, as shown in FIG. 12, the n-type part 22Gn is provided between the portions where the floating diffusion FD and the high-concentration p-type semiconductor area 101pc are provided on the surface of the substrate 101.

In the transfer gate electrode 22TG, the p-type part 22Gp is provided in the portion containing a p-type impurity on the side of the photodiode 21, as shown in FIGS. 12 and 13.

Here, as shown in FIG. 12, the p-type part 22Gp is formed in such a manner as to contain a portion facing the high-concentration p-type semiconductor area 101pc with the gate insulating film 22z in between on the surface of the substrate 101.

For example, it is preferable that the parts 22Gn and 22Gp be formed so that these fall within the range of the impurity concentration, such as those shown below. For example, by ion-implanting an impurity, the parts 22Gn and 22Gp are formed.

N-Type Part 22Gn
Impurity concentration: $1\times10^{19}$ cm$^{-3}$ or higher (preferably, $1\times10^{20}$ cm$^{-3}$ or higher)

P-Type Part 22Gp
Impurity concentration: $1\times10^{19}$ cm$^{-3}$ or higher (preferably, $1\times10^{20}$ cm$^{-3}$ or higher)

In addition to this, in the photodiode 21, it is preferable that the p-type semiconductor area 101pc provided on the top surface side of the substrate 101 has an impurity concentration lower than that in the case of the first embodiment.

For example, it is preferable that the p-type semiconductor area 101pc of the photodiode 21 be formed so that this falls within the range of the impurity concentration, such as that shown below.

P-Type Semiconductor Area 101pc
Impurity concentration: $5\times10^{16}$ to $5\times10^{18}$ cm$^{-3}$ (preferably, $1\times10^{17}$ to $1\times10^{18}$ cm$^{-3}$)

(2) Manufacturing Method

The main portion of a method of manufacturing a solid-state imaging device will be described.

Figure 14:
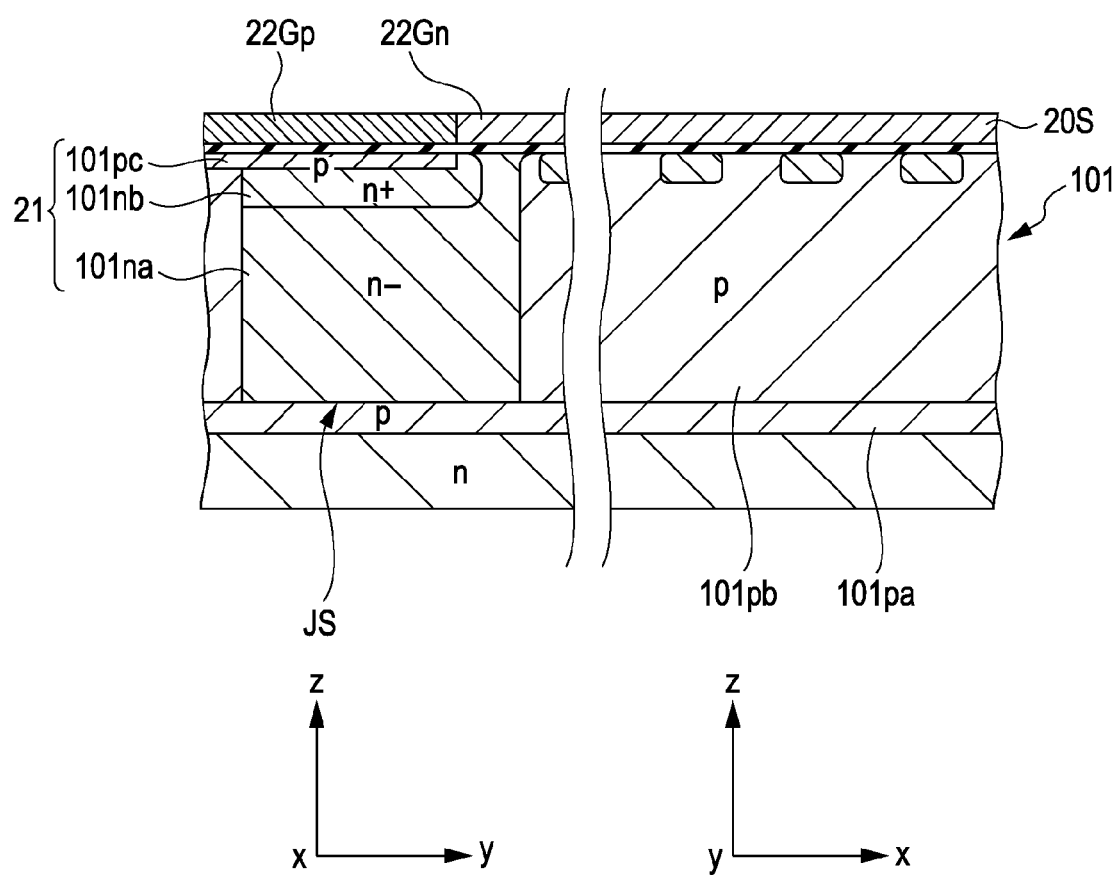
FIG. 14 illustrates a method of manufacturing the solid-state imaging device according to the second embodiment of the present invention.
Figure 15:
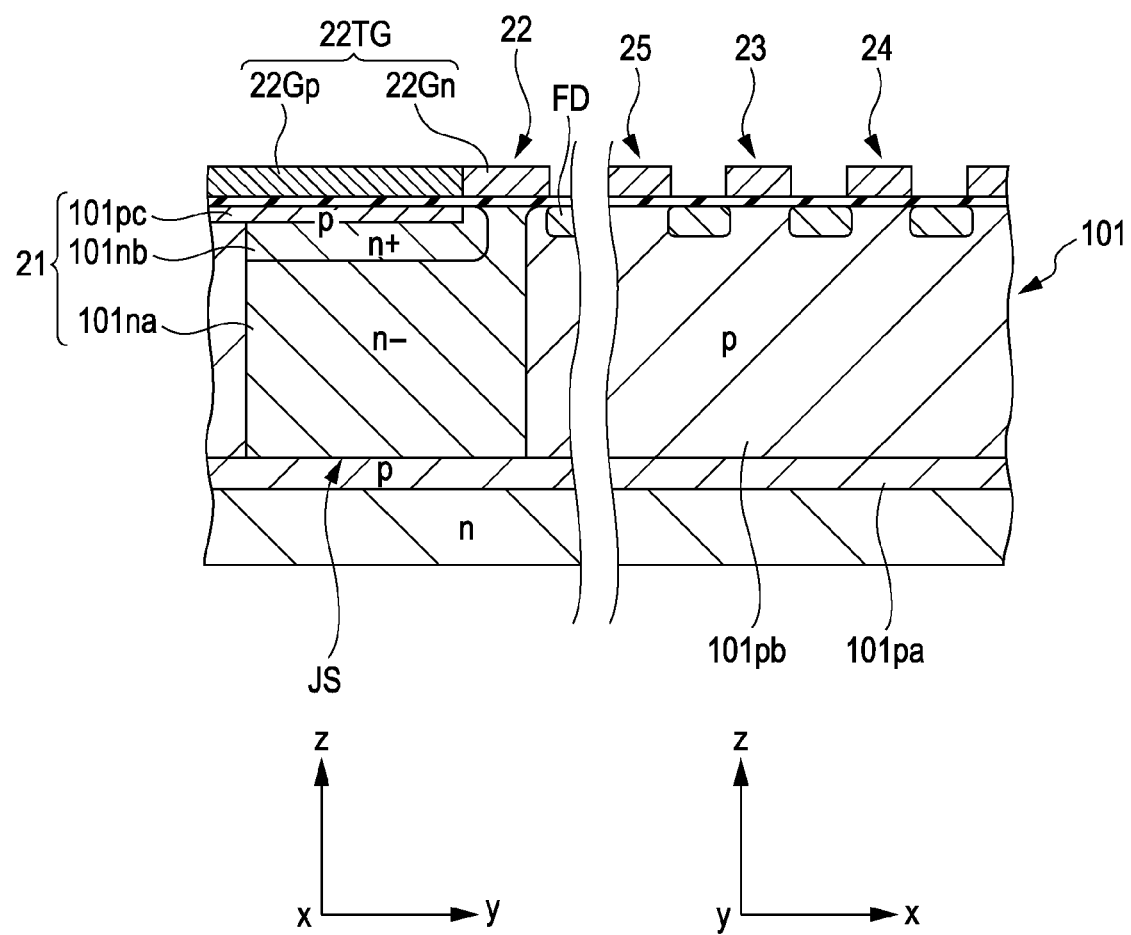
FIG. 15 illustrates a method of manufacturing the solid-state imaging device according to the second embodiment of the present invention.

FIGS. 14 and 15 illustrate a method of manufacturing a solid-state imaging device according to the second embodiment of the present invention.

Here, similarly to FIG. 12, FIGS. 14 and 15 illustrate a cross section. By sequentially undergoing each step shown in FIGS. 14 and 15, the solid-state imaging device 1 shown in FIG. 12, etc., is manufactured.

As shown in the first embodiment, the formation of the p-type semiconductor areas 101pa and 101pb, etc., the formation of the photodiode 21, and the formation of the insulating film 20z and the polysilicon film 20S are performed.

After that, as shown in FIG. 14, the n-type part 22Gn and the p-type part 22Gp are formed on the polysilicon film 20S.

Here, a portion other than the portion where the p-type part 22Gp of the transfer gate electrode 22TG is formed within the polysilicon film 20S is formed as an n-type part 22Gn. That is, the polysilicon film 20S is formed in such a manner that an n-type impurity is contained in the portion where the n-type part 22Gn of the transfer gate electrode 22TG forming the transfer transistor 22, and the gates of the other transistors 23, 24, and 25 are formed.

Then, the polysilicon film 20S is formed in such a manner that a p-type impurity is contained in the portion, within the polysilicon film 20S, where the p-type part 22Gp of the transfer gate electrode 22TG is formed.

(2-4) Formation of Pixel Transistor Tr

Next, as shown in FIG. 15, the transistors 22, 23, 24, and 25 forming the pixel transistor Tr are formed.

Here, by performing pattern processing on the polysilicon film 20S (see FIG. 8), the gate of each of the transistors 22, 23, 24, and 25 is formed. Then, the source and the drain (including the floating diffusion FD) of each of the transistors 22, 23, 24, and 25 are formed.

For example, the source and the drain of each of the transistors 22, 23, 24, and 25 are formed so that these fall within the range of the impurity concentration, which is the same as that of the first embodiment.

After that, similarly to the case of the first embodiment, after a wiring layer (not shown) is provided, a backup substrate (not shown) is bonded on the top surface of the wiring layer. Then, after the substrate 101 is reversed, a thinning film process is performed on the substrate 101. For example, by performing a CMP process as a thinning film process, a portion of the substrate 101 is removed from the reverse top surface side.

Then, as shown in FIG. 12, on the bottom surface side of the substrate 101, a color filter (not shown) and an on-chip lens (not shown) are provided. As a result of the above, a bottom surface irradiation type CMOS image sensor is completed.

In the foregoing, polysilicon containing an n-type impurity is used for the gate of each of the transistors 23, 24, and 25 other than the transfer transistor 22. The material is not limited to this. The gate may be formed by using, for example, polysilicon containing a p-type impurity.

(3) Operation

The operation of the solid-state imaging device will be described below.

In the present embodiment, similarly to the case of the first embodiment, operations for part (A) "shutter period", (B) "storage period", (C) "reset period", (D) "reset level read period", (E) "transfer period", and (F) "signal level read period" are sequentially performed (see FIGS. 10 and 11).

In the present embodiment, as shown in FIG. 12, etc., unlike the first embodiment, the transfer gate electrode 22TG is configured to include the n-type part 22Gn and the p-type part 22Gp. For this reason, between the p-type part 22Gp of the transfer gate electrode 22TG and the photodiode 21, a potential difference for the amount of a built-in potential (Obi) of PN junction occurs at all time regardless of the electrical potential applied to the transfer gate electrode 22TG. That is, the p-type part 22Gp of the transfer gate electrode 22TG reaches a state in which a negative bias for the amount of $\phi bi$ is applied. Therefore, the n-type charge storage area 101nb of the photodiode 21 can be formed in a shallower area from the surface of the substrate 101. Thus, it is possible to obtain an advantage in that the transfer efficiency is improved.

(4) Summary

As has been described above, in the present embodiment, similarly to the first embodiment, the gate electrode 22TG of the transfer transistor 22 is formed so as to extend with the gate insulating film 22z in between from the channel formed area to the portion where the photodiode 21 has been formed on the surface of the substrate 101. For this reason, in the present embodiment, the photodiode 21 does not directly receive damage due to the etching process performed at the time of pattern processing on the gate electrode 22TG, and the occurrence of dark current, white spots and the like can be suppressed.

Furthermore, in the present embodiment, the transfer gate electrode 22TG is configured to include the n-type part 22Gn and the p-type part 22Gp. Thus, it is possible to obtain an advantage in that the transfer efficiency is improved in the manner described above.

Therefore, in the present embodiment, the image quality of captured images can be improved.

3. Third Embodiment (1) Device Configuration

Figure 16:
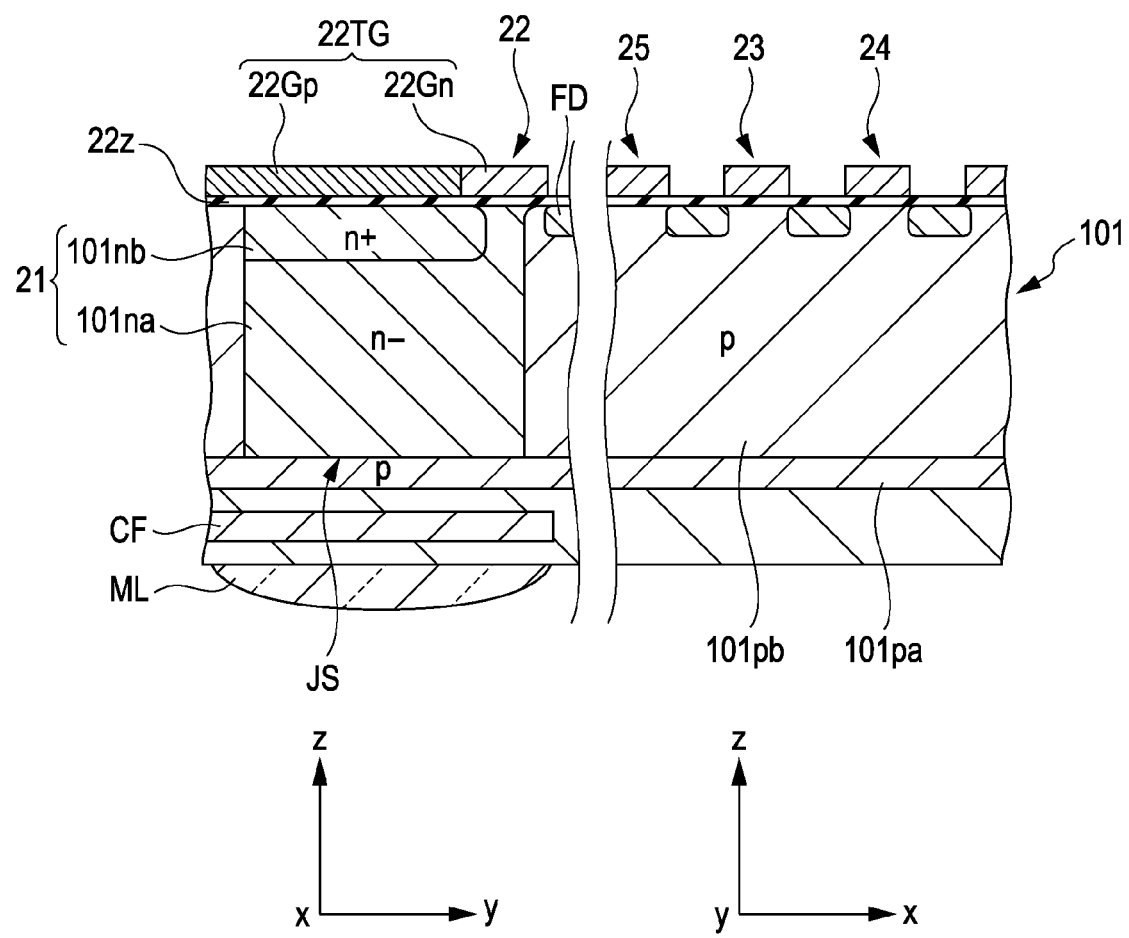
FIG. 16 illustrates the main portion of a solid-state imaging device according to a third embodiment of the present invention.

FIG. 16 illustrates the main portion of a solid-state imaging device according to a third embodiment of the present invention.

Here, similarly to FIG. 12, FIG. 16 illustrates the cross section of a pixel P.

As shown in FIG. 16, in the present embodiment, as can be understood from a comparison with FIG. 12, the configuration of the photodiode 21 differs from the second embodiment. The present embodiment is the same as the second embodiment except for this point. Accordingly, repeated description thereof is omitted.

As shown in FIG. 16, in the present embodiment, regarding the photodiode 21, the p-type semiconductor area 101pc that is provided in the second embodiment is not formed on the top surface side of the substrate 101.

For this reason, in the transfer gate electrode 22TG, the p-type part 22Gp is formed in such a manner as to face the n-type charge storage area 101nb of the photodiode 21 with the gate insulating film 22z in between. That is, the p-type part 22Gp is provided in such a manner as to face the n-type charge storage area 101nb of the photodiode 21 without the semiconductor area of the same conduction type therebetween.

(2) Operation

The operation of the solid-state imaging device will be described below.

In the present embodiment, similarly to the case of the second embodiment, operations for part (A) "shutter period", (B) "storage period", (C) "reset period", (D) "reset level read period", (E) "transfer period", and (F) "signal level read period" are sequentially performed (see FIGS. 10 and 11).

In the present embodiment, as shown in FIG. 16, unlike the second embodiment, the p-type part 22Gp is formed in such a manner as to face the n-type charge storage area 101nb of the photodiode 21 with the gate insulating film 22z in between. At this time, the p-type part 22Gp reaches a state in which a negative bias for the amount of $\phi bi$ has been applied. Therefore, when compared to the second embodiment, the n-type charge storage area 101*nb* of the photodiode 21 can be formed in a shallower area from the surface of the substrate 101. Consequently, it is possible to obtain an advantage in that the transfer efficiency is improved, and it is possible to omit the step of forming the p-type semiconductor area 101*pc*.

(4) Summary

As has been described above, in the present embodiment, similarly to the second embodiment, the gate electrode 22TG of the transfer transistor 22 is formed in such a manner as to extend from the channel formed area to the portion where the photodiode 21 has been formed with the gate insulating film 22*z* in between on the surface of the substrate 101. For this reason, in the present embodiment, the photodiode 21 does not directly receive damage due to the etching process performed at the time of pattern processing on the gate electrode 22TG. Thus, the occurrence of dark current, white spots, and the like can be suppressed.

Furthermore, in the present embodiment, since the transfer gate electrode 22TG is configured to include the n-type part 22Gn and the p-type part 22Gp, as described above, it is possible to obtain, for example, an advantage in that the transfer efficiency is improved.

Therefore, it is possible in the present embodiment to improve the image quality of captured images.

4. Fourth Embodiment (1) Operation

Figure 17:
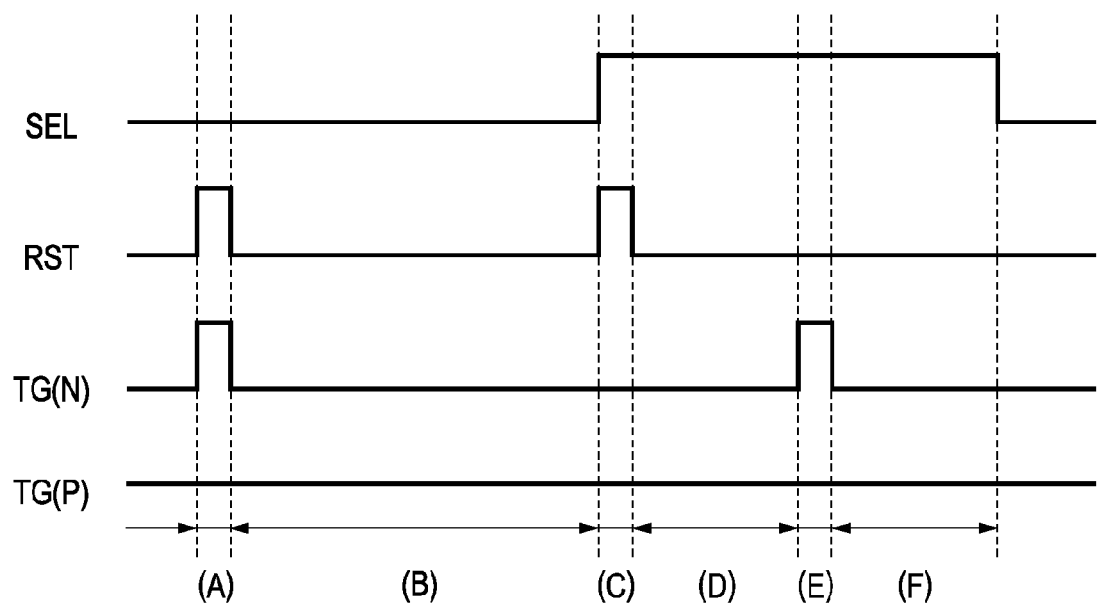
FIG. 17 illustrates the operation of a solid-state imaging device according to a fourth embodiment of the present invention.

FIG. 17 illustrates the operation of a solid-state imaging device according to a fourth embodiment of the present invention.

As shown in FIG. 17, in the present embodiment, as can be understood from a comparison with FIG. 10, the operation thereof differs from that of the second embodiment. The present embodiment is the same as the second embodiment except for this point. Accordingly, repeated description thereof is omitted.

FIG. 17 illustrates the operation of the solid-state imaging device, and also is a timing chart illustrating a pulse signal to be supplied to each unit when a signal is read from a pixel P. In FIG. 17, "SEL" indicates a "selection signal" to be input to the gate of the selection transistor 24. "RST" indicates a "reset signal" to be input to the gate of the reset transistor 25. "TG(N)" indicates a "transfer signal" to be input to the n-type part 22Gn of the transfer transistor 22. "TG(P)" indicates a "control signal" to be input to the p-type part 22Gp of the transfer transistor 22.

In FIG. 17, similarly to FIG. 10, part (A) indicates a "shutter period", part (B) indicates a "storage period", part (C) indicates a "reset period", part (D) indicates a "reset level read period", part (E) indicates a "transfer period", and part (F) indicates a "signal level read period".

As shown in FIG. 17, similarly to the case shown in FIG. 10, the selection signal SEL is input to the gate of the selection transistor 24 in each of the periods (A) to (F). Also, as shown in FIG. 17, similarly to the case shown in FIG. 10, the reset signal RST is input to the gate of the reset transistor 25 in each of the periods (A) to (F).

Similarly to the transfer signal TG shown in FIG. 10, the transfer signal TG(N) is input to the n-type part 22Gn of the transfer transistor 22.

Then, regarding the transfer signal TG(P), a negative fixed potential (for example, −1 V) is input to the p-type part 22Gp of the transfer transistor 22.

In the manner described above, in the present embodiment, the solid-state imaging device of the second embodiment shown in FIG. 12 is driven to operate as shown in FIG. 17.

Here, as shown in FIG. 17, unlike the second embodiment, a negative fixed potential (for example, −1 V) is input to the p-type part 22Gp of the transfer transistor 22 in each of the periods (A) to (F). As described above, conduction is made to each of the p-type part 22Gp and the n-type part 22Gn of the transfer transistor 22, and a different potential is supplied to them. For this reason, in the present embodiment, it is possible to improve the degree of freedom of potential design that completely transfers the carriers of the photodiode 21.

(2) Summary

As has been described above, in the present embodiment, similarly to the second embodiment, the gate electrode 22TG of the transfer transistor 22 is formed in such a manner as to extend with the gate insulating film 22*z* in between from the channel formed area to the portion where the photodiode 21 has been formed on the surface of the substrate 101. Consequently, in the present embodiment, the photodiode 21 does not directly receive damage due to the etching process performed at the time of pattern processing, and the occurrence of dark currents, white spots, and the like can be suppressed.

Furthermore, in the present embodiment, since a different potential is supplied to each of the p-type part 22Gp and the n-type part 22Gn of the transfer transistor 22, the degree of freedom of potential design can be improved.

Therefore, in the present embodiment, the image quality of captured images can be improved.

(3) Modification

In the above-described fourth embodiment, the case in which the solid-state imaging device of the second embodiment shown in FIG. 12 is driven to operate as shown in FIG. 17 has been described. Alternatively, the solid-state imaging device of the third embodiment, shown in FIG. 16, may be driven to operate, as shown in FIG. 17.

In this modification as shown in FIG. 17, unlike the third embodiment, a negative fixed potential (for example, −1 V) is input to the p-type part 22Gp of the transfer transistor 22 in each of the periods (A) to (F). Consequently, also, in the present modification, it is possible to obtain an advantage similar to that described above.

Figure 18:
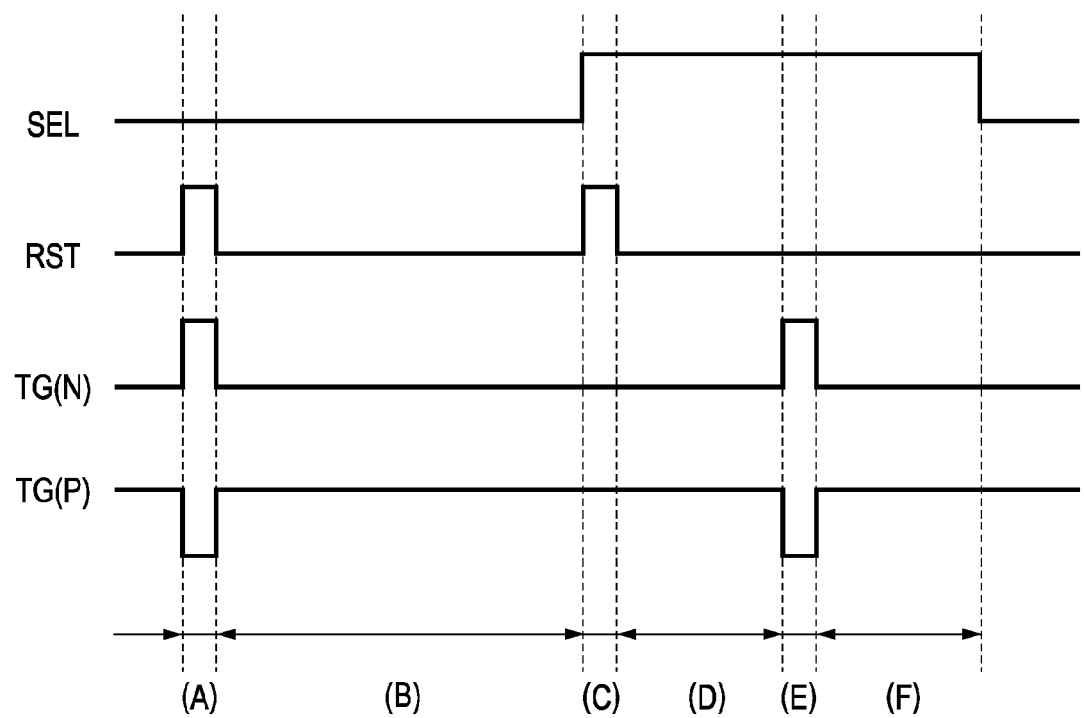
FIG. 18 illustrates the operation of a solid-state imaging device according to a modification of the fourth embodiment of the present invention.

In addition to this, the solid-state imaging device may be driven as shown in FIG. 18. More specifically, regarding a control signal TG(P) to be input to the p-type part 22Gp of the transfer transistor 22, in the transfer periods (A) and (E), a negative potential (for example, −2 V), which is different from that in the other periods ((B) to (D), and (F)), may be input.

In this modification, the difference between the potential of the photodiode 21 portion and the potential of the transfer transistor 22 portion can be increased to more than that of the fourth embodiment. Consequently, it is possible to obtain an advantage in that the transfer efficiency is further improved.

5. Others

The present invention is not limited to the above-described embodiments, and various modifications can be made.

In the above-described embodiments, the case has been described in which four types of transistors, that is, a transfer transistor, an amplification transistor, a selection transistor, and a reset transistor, are provided as pixel transistors. The present invention is not limited to this. For example, the present invention may be applied to a case in which three types of transistors, that is, a transfer transistor, an amplification transistor, and a reset transistor, are provided as pixel transistors.

In the above-described embodiments, the case has been described in which each one of a transfer transistor, an amplification transistor, a selection transistor, and a reset transistor is provided with respect to one photodiode. The present invention is not limited to this. For example, the present invention may be applied to a case in which each one of an amplification transistor, a selection transistor, and a reset transistor is provided with respect to a plurality of photodiodes.

Furthermore, in the above-described embodiments, the case in which the present invention is applied to a camera has been described. However, the present invention is not limited to this. The present invention may be applied to another electronic apparatus including a solid-state imaging device, like a scanner, a copying machine, or the like.

In the above-described embodiments, the solid-state imaging device 1 corresponds to the solid-state imaging device of the present invention. The photodiode 21 corresponds to the photoelectric conversion unit of the present invention. The transfer transistor 22 corresponds to the transfer transistor of the present invention. The transfer gate electrode 22TG corresponds to the gate electrode of the present invention. The gate insulating film 22z corresponds to the gate insulating film of the present invention. The substrate 101 corresponds to the semiconductor substrate of the present invention. The n-type charge storage areas 101na and 101nb correspond to the second impurity area of the present invention. The p-type semiconductor area 101pa corresponds to the first impurity area of the present invention. The p-type semiconductor area 101pc corresponds to the third impurity area of the present invention. The floating diffusion FD corresponds to the floating diffusion of the present invention. The pixel P corresponds to the pixel of the present invention. The pixel area PA corresponds to the pixel area of the present invention. The pixel transistor Tr corresponds to the pixel transistor of the present invention.

The present application contains subject matter related to that disclosed in Japanese Priority Patent Application JP 2009-267339 filed in the Japan Patent Office on Nov. 25, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a substrate having oppositely facing first and second surfaces;
a plurality of pixels in a pixel area of the substrate, each pixel have a corresponding photoelectric conversion unit in the substrate and configured to receive light and generate signal charge; and
for each pixel, pixel transistors configured to output the signal charge generated by the photoelectric conversion unit as an electrical signal, each of the pixel transistors being provided on the second surface of the semiconductor substrate opposite the first surface, wherein the first surface of the substrate is a light receiving surface, wherein,
each of the pixel transistors includes at least a transfer transistor that transfers the signal charge generated in the photoelectric conversion unit of the corresponding pixel to a floating diffusion, and
a gate electrode of the transfer transistor is formed in such a manner as to extend with a gate insulating film from the floating diffusion to over the photoelectric conversion unit with the gate insulating film between the gate electrode and the second surface, wherein a first portion of the gate electrode includes an impurity of a first conduction type, and wherein a second portion of the gate electrode includes an impurity of a second conduction type.

2. The solid-state imaging device according to claim 1, wherein:
each of the photoelectric conversion units includes at least a first impurity area of a first conduction type, and a second impurity area of a second conduction type different from the first conduction type, and
the first impurity area and the second impurity area are sequentially formed from the first surface side toward the second surface side on the semiconductor substrate.

3. The solid-state imaging device according to claim 2, wherein:
the photoelectric conversion unit further includes a third impurity area of the first conduction type, and
the third impurity area is formed nearer the second surface than the second impurity area on the semiconductor substrate is.

4. The solid-state imaging device according to claim 3, wherein the first conduction type is of a p type, and the second conduction type is of an n type.

5. The solid-state imaging device according to one of claims 1 to 4,
wherein the gate electrode of the transfer transistor is formed from polysilicon.

6. The solid-state imaging device according to one of claims 1 to 4, wherein:
the gate electrode of the transfer transistor is formed from polysilicon, and
in the gate electrode, a portion on the side of the photoelectric conversion unit includes an impurity of the first conduction type, and in the gate electrode, a portion other than the portion on the side of the photoelectric conversion unit includes an impurity of the second conduction type.

7. The solid-state imaging device according to claim 6, wherein:
in the gate electrode of the transfer transistor, a portion on the side of the floating diffusion has a transfer signal applied thereto, and
in the gate electrode, a portion other than the portion on the side of the floating diffusion has a voltage different from that on the side of the floating diffusion applied thereto.

8. An electronic apparatus comprising:
a plurality of photoelectric conversion units configured to receive light and generate signal charge, the plurality of photoelectric conversion units being provided in such a manner as to correspond to a plurality of pixels in a pixel area of a semiconductor substrate; and
pixel transistors configured to output the signal charge generated by the photoelectric conversion units as electrical signals, each of the pixel transistors being provided on a second surface of the semiconductor substrate opposite to a first surface of the semiconductor substrate, and the first surface having the photoelectric conversion units that receive light provided thereon, wherein each of the pixel transistors includes at least a transfer transistor that transfers the signal charge generated in the photoelectric conversion unit to a floating diffusion corresponding to a drain, and wherein a gate electrode of the transfer transistor is formed in such a manner as to extend with a gate insulating film in between from a channel formed area to a portion where the photoelectric conversion unit has been formed on the second surface of the semiconductor substrate, wherein a first portion of the gate electrode includes an impurity of a first conduction type, and wherein a second portion of the gate electrode includes an impurity of a second conduction type.

9. An imaging device comprising:

a substrate having oppositely facing first and second sides, the first side being a light incident side via which light is received, the substrate being of a first conductivity type; and at least one pixel having (a) a photoelectric conversion region of a second conductivity type opposite the first conductivity type, (b) a floating diffusion, (c) a transfer transistor effective to transfer electrical charges from the photoelectric conversion unit to the floating diffusion, and (d) a hole-accumulation region of the first conductivity type between the photoelectric conversion region and the second side, wherein, the imaging device is a back illumination type device;

the transfer transistor has a gate electrode and a gate insulating film between the gate electrode and the second side, the transfer transistor gate electrode and the transfer transistor gate insulating film extend from the floating diffusion to over the photoelectric conversion region including over a channel between the floating diffusion and the photoelectric conversion unit, wherein a first portion of the transfer transistor gate electrode includes an impurity of a first conduction type, and wherein a second portion of the transfer transistor gate electrode includes an impurity of a second conduction type.

10. The imaging device of claim 9, wherein the first conduction type is a p type, and the second conduction type is an n type.

11. The imaging device of claim 9, wherein the transfer transistor gate electrode is formed from polysilicon.

* * * * *